United States Patent
Lin et al.

(10) Patent No.: US 10,310,941 B2
(45) Date of Patent: Jun. 4, 2019

(54) DATA ENCODING METHOD, MEMORY CONTROL CIRCUIT UNIT AND MEMORY STORAGE DEVICE

(71) Applicant: PHISON ELECTRONICS CORP., Miaoli (TW)

(72) Inventors: Wei Lin, Taipei (TW); Chih-Kang Yeh, Kinmen County (TW); Yu-Cheng Hsu, Yilan County (TW); Szu-Wei Chen, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 15 days.

(21) Appl. No.: 15/820,461

(22) Filed: Nov. 22, 2017

(65) Prior Publication Data

US 2019/0114226 A1    Apr. 18, 2019

(30) Foreign Application Priority Data

Oct. 17, 2017    (TW) .............................. 106135412 A

(51) Int. Cl.
| | |
|---|---|
| H03M 13/00 | (2006.01) |
| G06F 11/10 | (2006.01) |
| G06F 3/06 | (2006.01) |
| G11C 29/52 | (2006.01) |
| H03M 13/29 | (2006.01) |

(52) U.S. Cl.
CPC .......... *G06F 11/1068* (2013.01); *G06F 3/065* (2013.01); *G06F 3/0619* (2013.01); *G06F 3/0655* (2013.01); *G06F 3/0679* (2013.01); *G11C 29/52* (2013.01); *H03M 13/2906* (2013.01)

(58) Field of Classification Search
CPC .. G06F 11/1068; G06F 3/0679; G06F 3/0655; G06F 3/0619; G06F 3/065; G11C 29/52; H03M 13/2906
See application file for complete search history.

(56) References Cited

U.S. PATENT DOCUMENTS 8,176,234 B2 * 5/2012 Franceschini ....... G06F 12/0246
365/185.33

* cited by examiner

*Primary Examiner* — Samir W Rizk
(74) *Attorney, Agent, or Firm* — JCIPRNET

(57) ABSTRACT

A data encoding method, a memory control circuit unit and a memory storage device are provided. The method includes: writing a first data into a first physical programming units; writing a second data into a second physical programming units; encoding by using the first data without using the second data to generate a first encoded data; encoding by using the second data and a first sub-data of the first data to generate a second encoded data; and writing the first encoded data and the second encoded data into a third physical programming unit and a fourth physical programming unit.

30 Claims, 11 Drawing Sheets

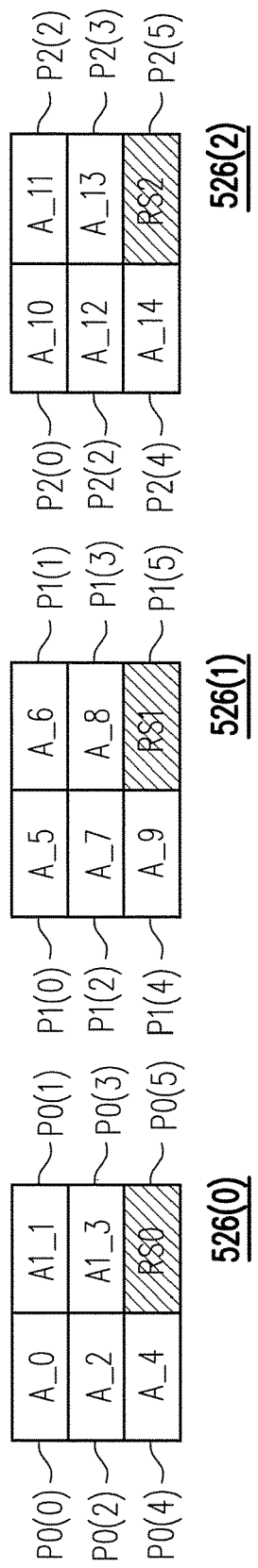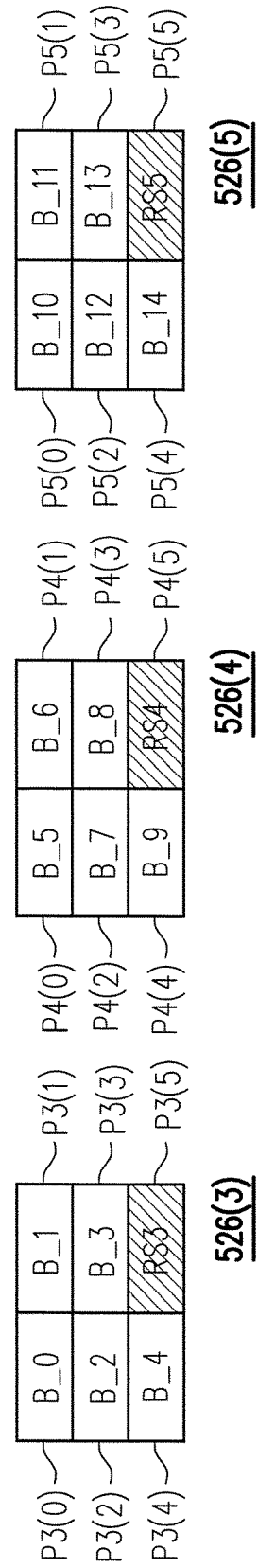
FIG. 9A
FIG. 9B

DATA ENCODING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 106135412, filed on Oct. 17, 2017. The entirety of the above-mentioned patent application is hereby incorporated by reference herein and made a part of this specification.

BACKGROUND

Technical Field

The invention relates to a data encoding method, a memory control circuit unit and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, after a data is being written into the rewritable non-volatile memory module, the written data is usually encoded to generate an encoded data. The encoded data may be used in the subsequent accessing process for checking and correcting errors of the data. Nonetheless, when the data is being written into physical programming units formed by memory cells on different word lines in the rewritable non-volatile memory module, the physical programming units on the different word lines may have different error rates due to physical characteristics of the rewritable non-volatile memory module. During the process of generating the encoded data, if once specific encoded data is generated by using data in the physical programming unit having a higher error rate, an error checking and correcting capability of that specific encoded data is also lower.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a data encoding method, a memory control circuit unit and a memory storage device, which are capable of dividing a rewritable non-volatile memory module into at least two areas. Each of the areas can generate the encoded data by using respective encoding methods of their own. Accordingly, an error checking and correcting capability of an encoded data for decoding data in word lines with a higher error rate may be improved.

The invention provides a data encoding method for a rewritable non-volatile memory module. The rewritable non-volatile memory module includes a plurality of physical programming units, and the data encoding method includes: writing a first data into a first physical programming unit among the physical programming units; writing a second data into a second physical programming unit among the physical programming units; encoding by using the first data without using the second data to generate a first encoded data; encoding by using the second data and at least one first sub-data of the first data to generate a second encoded data; and writing the first encoded data and the second encoded data into a third physical programming unit and a fourth physical programming unit among the physical programming units respectively.

The invention provides a memory control circuit unit configured to control a rewritable non-volatile memory module. The rewritable non-volatile memory module includes a plurality of physical programming units. The memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured perform the following operations: writing a first data into a first physical programming unit among the physical programming units; writing a second data into a second physical programming unit among the physical programming units; encoding by using the first data without using the second data to generate a first encoded data; encoding by using the second data and at least one first sub-data of the first data to generate a second encoded data; and writing the first encoded data and the second encoded data into a third physical programming unit and a fourth physical programming unit among the physical programming units respectively.

The invention provides a memory storage device. The memory storage device includes a connection interface unit, a rewritable non-volatile memory module and a memory control circuit unit. The connection interface unit is configured to couple to a host system. The rewritable non-volatile memory module includes a plurality of areas. Each area among the areas includes a plurality of physical programming units. The memory control circuit unit is coupled to the connection interface unit and the rewritable non-volatile memory module. The memory control circuit unit is configured to perform the following operations: writing a first data into a first physical programming unit among the physical programming units; writing a second data into a second physical programming unit among the physical programming units; encoding by using the first data without using the second data to generate a first encoded data; encoding by using the second data and at least one first sub-data of the first data to generate a second encoded data; and writing the first encoded data and the second encoded data into a third physical programming unit and a fourth physical programming unit among the physical programming units respectively.

Based on the above, the data encoding method, the memory control circuit unit and the memory storage device proposed by the invention are capable of dividing the rewritable non-volatile memory module into at least two areas. Each of the areas can generate the encoded data by using respective encoding methods of their own. Accordingly, the error checking and correcting capability of the encoded data for decoding data in the word lines with the higher error rate may be improved.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9A and FIG. 9B are schematic diagrams illustrating data stored in each word line and a corresponding encoded data according to a first exemplary embodiment of the invention.

DESCRIPTION OF THE EMBODIMENTS

Figure 1:
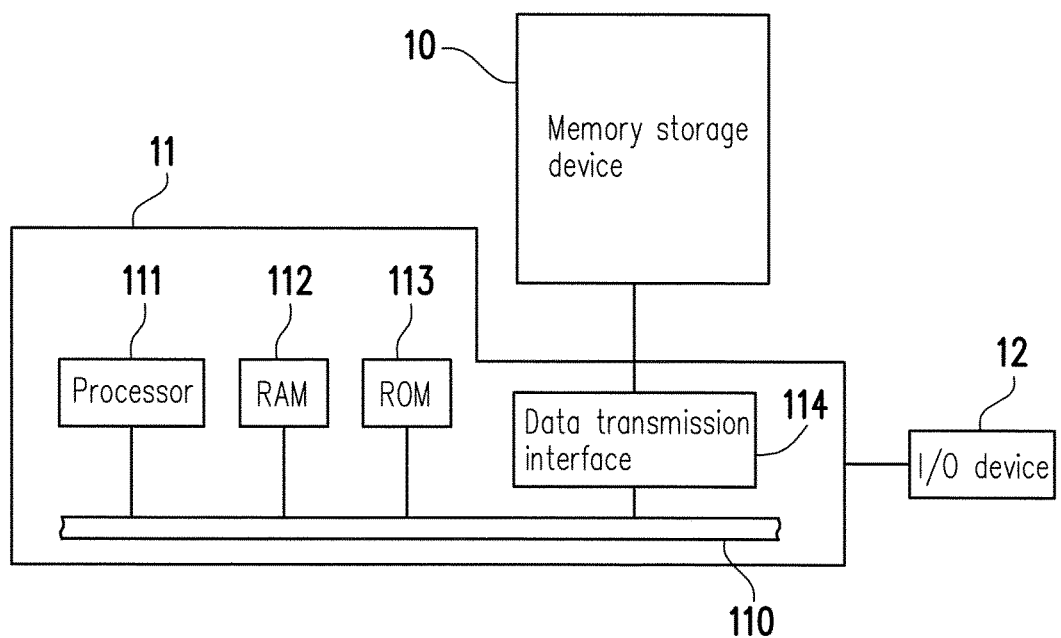
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
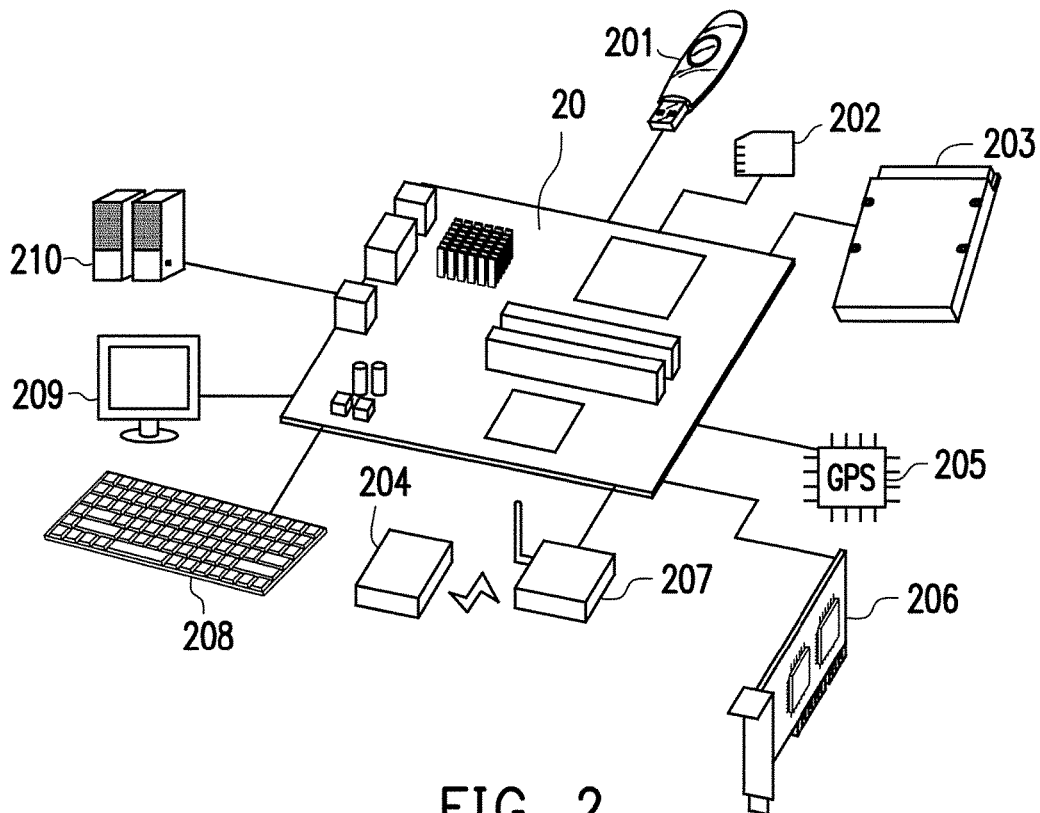
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 510 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
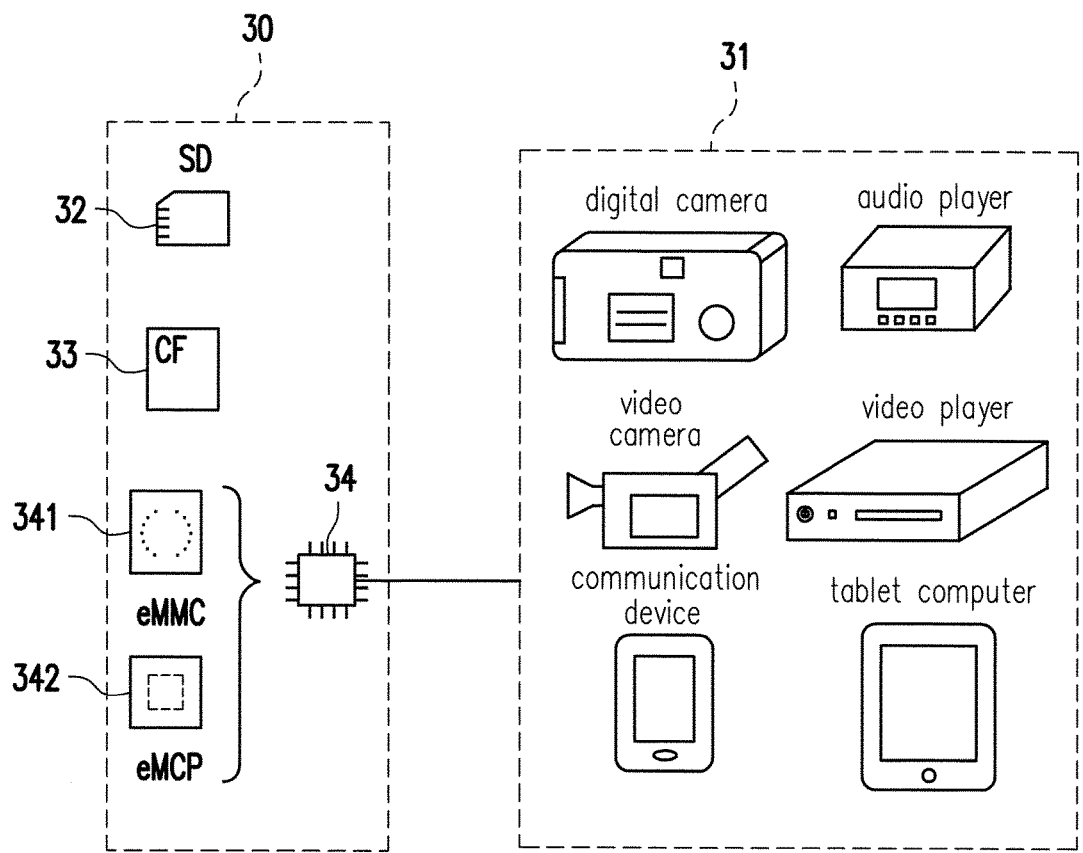
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in the foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, and a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
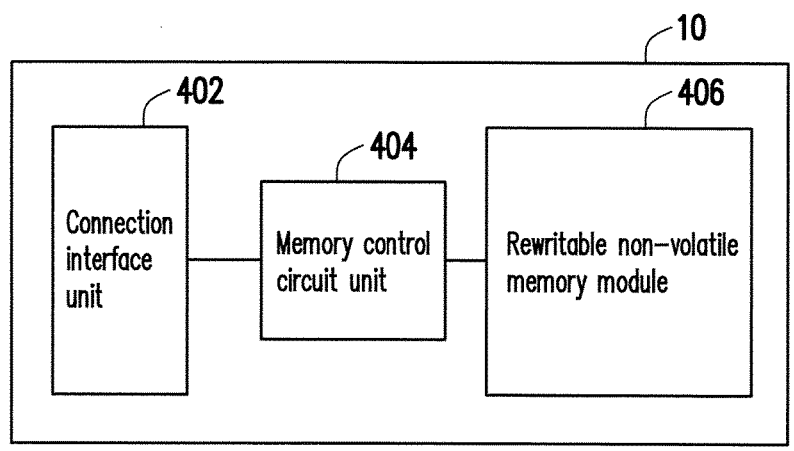
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. Hereinafter, a two-dimensional array and a two-dimensional array are used to describe the memory cell arrays in different exemplary embodiments, respectively. However, it should be noted that, the following exemplary embodiments are simply several examples of the memory cell array. In other exemplary embodiments, a disposition method of the memory cell array may be adjusted to satisfy actual requirements.

Figure 5A:
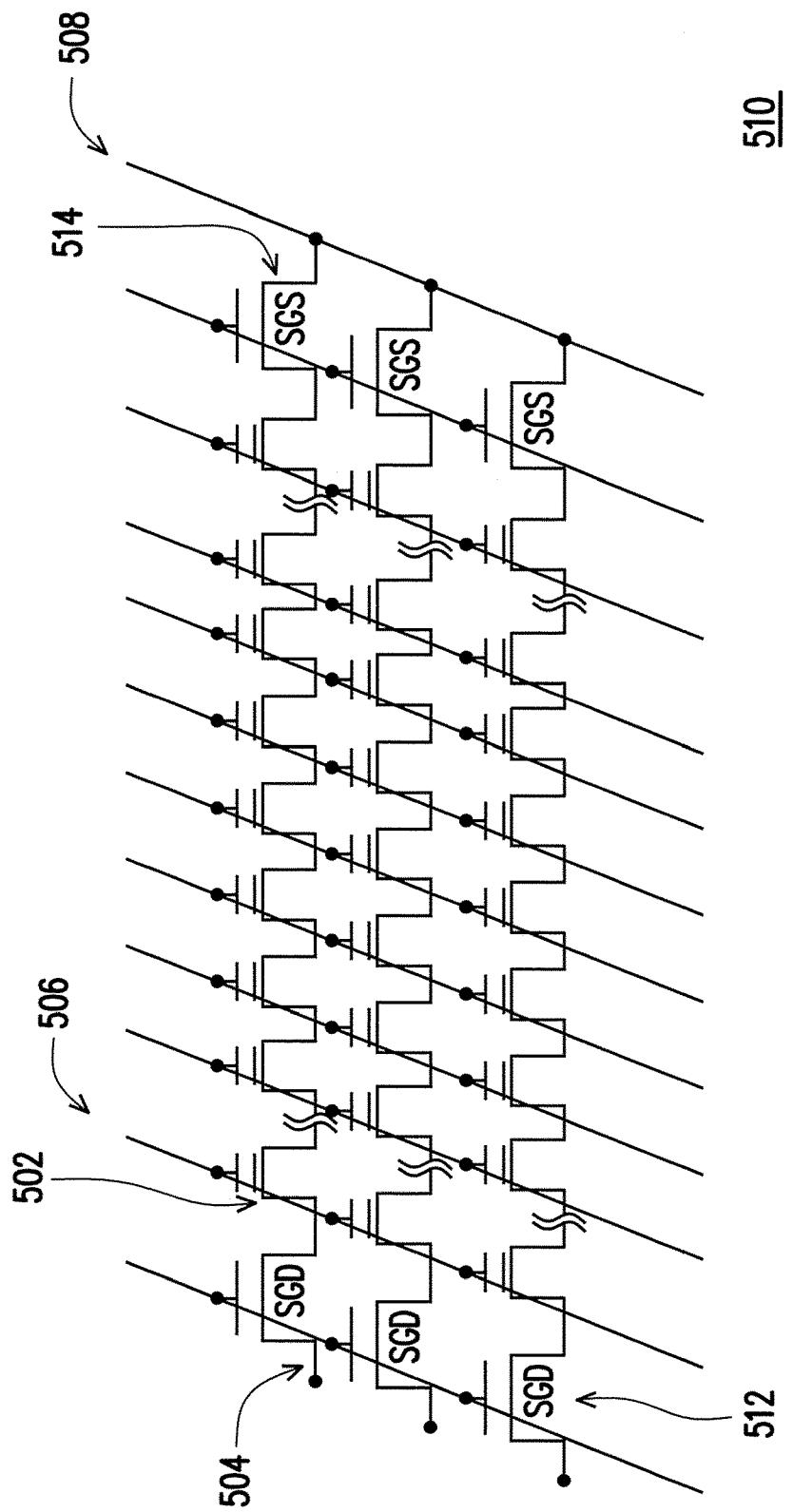
FIG. 5A is a schematic diagram illustrating a memory cell array according to an exemplary embodiment of the invention.

FIG. 5A is a schematic diagram illustrating a memory cell array according to an exemplary embodiment of the invention.

Referring to FIG. 5A, a memory cell array 510 includes a plurality of memory cells 502 used to store data, a plurality of SGD (select gate drain) transistors 512, a plurality of SGS (select gate source) transistors 514, as well as a plurality of bit lines 504, a plurality of word lines 506, a common source line 508 connected to the memory cells. The memory cells 502 are disposed at intersections of the bit lines 504 and the word lines 706 in arrays.

Figure 5B:
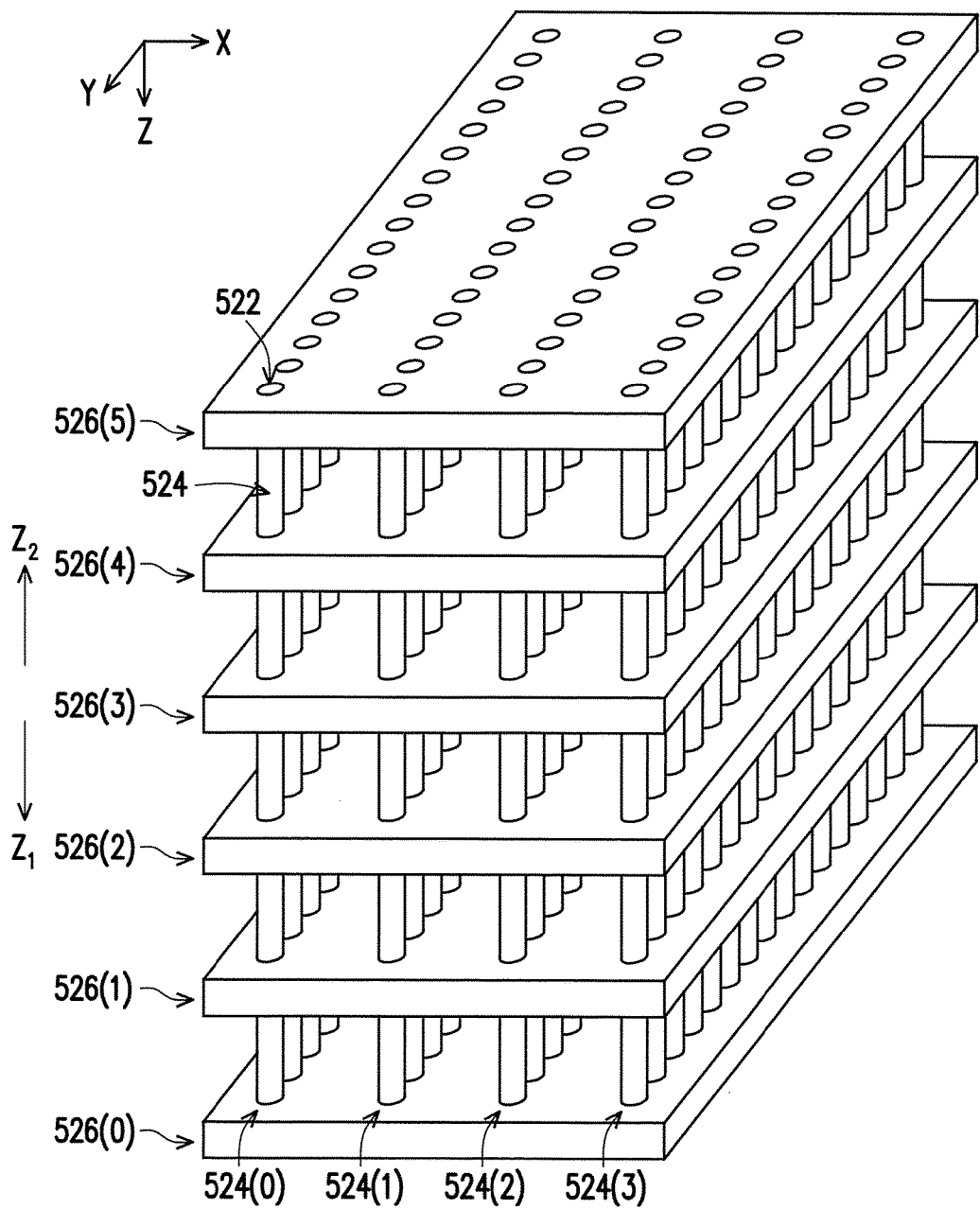
FIG. 5B is a schematic diagram illustrating a memory cell array according to another exemplary embodiment of the invention.

FIG. 5B is a schematic diagram illustrating a memory cell array according to another exemplary embodiment of the invention.

Referring to FIG. 5B, in the present exemplary embodiment, the memory cell array includes a plurality of memory cells 522 configured to store data, a plurality of bit line groups 524(0) to 524(3) and a plurality of word lines 526(0) to 526(5). In the exemplary embodiment of FIG. 5B, each word line among the word lines 526(0) to 526(5) may also be referred to as a word line layer. The bit line groups 524(0) to 524(3) are independent from one another (e.g., separated from one another) and arranged along a direction (e.g., X-axis). Each word line group among the bit line groups 524(0) to 524(3) includes a plurality of bit lines 524 independent from one another (e.g., separated from one another). The bit lines 524 included in the bit line groups 524(0) to 524(3) are arranged along a direction (e.g., Y-axis) and extended towards another direction (e.g., Z-axis). The word lines 526(0) to 526(5) are independent from one another (e.g., separated from one another) and stacked along the direction of Z-axis. In this exemplary embodiment, each word line among the word lines 526(0) to 526(5) may be regarded as one word line plane. The memory cell 522 is disposed at each of intersections between the bit lines 524 in the bit line groups 524(0) to 524(3) and the word lines 526(0) to 526(5). However, in another exemplary embodiment, one bit line group may include more or less bit lines, and one word line may also allow more or less bit lines to pass through.

In the rewritable non-volatile memory module 406, one or more bits are stored based on changes on a voltage (hereinafter, also known as a threshold voltage) of each of the memory cells. When a write command sequence or a read command sequence is received from the memory control circuit unit 404, a control circuit (not illustrated) in the rewritable non-volatile memory module 406 controls a voltage applied to one specific word line or one specific bit line (or bit line group) to change the threshold voltage of at least one memory cell or detect a storage state of the memory cell. For example, a charge trapping layer is provided between a control gate and a channel in each of the memory cells. Amount of electrons in the charge trapping layer may be changed by applying a write voltage (or a program voltage) to the control gate thereby changing the threshold voltage of the memory cell. This process of changing the threshold voltage is also known as "writing data into the memory cell" or "programming the memory cell". With changes in the threshold voltage, each of the memory cells in the rewritable non-volatile memory module 406 can have a plurality of storage states. The storage state to which the memory cell belongs may be determined by applying a read voltage to the memory cell, so as to obtain the one or more bits stored in the memory cell.

In addition, the memory cells of the rewritable non-volatile memory module 406 constitute a plurality of physical programming units, and the physical programming units constitute a plurality of physical erasing units. Specifically, the memory cells on the same word line in FIG. 5A or the same word line in FIG. 5B constitute one or more of the physical programming units. For example, if the rewritable non-volatile memory module 406 is the MLC NAND flash memory module, the memory cells on intersections between the same word line and the bit lines constitute 2 physical programming units. Alternatively, if the rewritable non-volatile memory module 406 is the TLC NAND flash memory module, the memory cells on intersections between the same word line and the bit lines constitute 3 physical programming units.

In the present exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., an error correcting code). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

In an exemplary embodiment where one memory cell is capable of storing multiple bits (e.g., the MLC or TLC flash memory module), the physical programming units belonging to the same word line (or the same word line layer) may at least be classified into a lower physical programming unit and an upper physical programming unit. For instance, in the MLC NAND flash memory module, a least significant bit (LSB) of a memory cell belongs to the lower physical programming unit, and a most significant bit (MSB) of one memory cell belongs to the upper physical programming unit. Moreover, a reliability of the lower physical programming unit is normally higher than a reliability of the upper physical programming unit. In an exemplary embodiment, the lower physical programming unit is also known as a fast page, and the upper physical programming unit is also known as a slow page. In addition, in the TLC NAND flash memory module, a least significant bit (LSB) of a memory cell belongs to the lower physical programming unit, a center significant bit (CSB) of that memory cell belongs to the upper physical programming unit, and a most significant bit (MSB) of that memory cell belongs to the upper physical programming unit.

Figure 6:
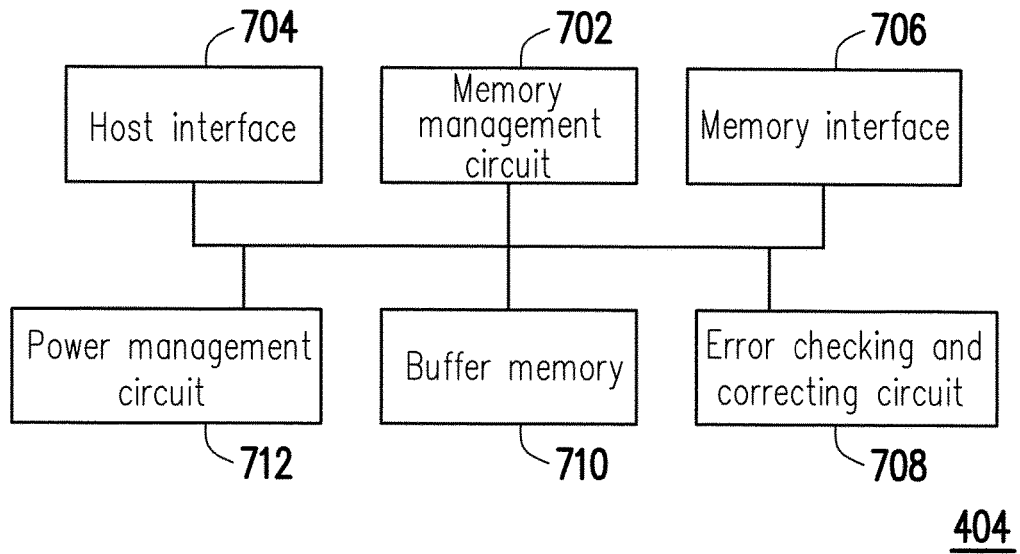
FIG. 6 is a schematic block diagram illustrating a memory control circuit unit according to an exemplary embodiment of the invention.

FIG. 6 is a schematic block diagram illustrating a memory control circuit unit according to an exemplary embodiment of the invention.

Referring to FIG. 6, the memory control circuit unit 404 includes a memory management circuit 702, a host interface 704, a memory interface 706 and an error checking and correcting circuit 708.

The memory management circuit 702 is configured to control overall operations of the memory control circuit unit 404. Specifically, the memory management circuit 702 has a plurality of control commands. When the memory storage device 10 operates, the control commands are executed to perform various operations such as data writing, data reading and data erasing. Hereinafter, description regarding operations of the memory management circuit 702 or any circuit element in the memory control circuit unit 404 is equivalent to description regarding operations of the memory control circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 702 when the memory control circuit unit 404 is enabled. Then, the control commands are executed by the microprocessor unit to perform operations, such as writing, reading or erasing data.

Further, in another exemplary embodiment, the control commands of the memory management circuit 702 may also be implemented in a form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In the present exemplary embodiment, the host interface 704 is compatible with the SATA standard. Nevertheless, it should be understood that the invention is not limited to the above. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 through the memory interface 706, for example. The command sequences may include one or more signals, or data transmitted in the bus. The signals or the data may include command codes and program codes. For example, information such as identification codes and memory addresses are included in the read command sequence.

The error checking and correcting circuit 708 is coupled to the memory management circuit 702 and configured to perform an error checking and correcting operation to ensure integrity of data. Specifically, when the memory management circuit 702 receives the write command from the host system 11, the error checking and correcting circuit 708 generates an ECC (error correcting code) and/or an EDC (error detecting code) for data corresponding to the write command, and the memory management circuit 702 writes data and the ECC and/or the EDC corresponding to the write command into the rewritable non-volatile memory module 406. Later, when reading the data from the rewritable non-volatile memory module 406, the memory management circuit 702 will read the corresponding ECC and/or the EDC, and the error checking and correcting circuit 708 will perform the error checking and correcting operation on the read data based on the ECC and/or the EDC.

In an exemplary embodiment, the memory control circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

In this exemplary embodiment, the error checking and correcting circuit 708 can perform a single-frame encoding for the data stored in the same physical programming unit and can also perform a multi-frame encoding for data stored in multiple physical programming units. An algorithm for the multi-frame encoding (a.k.a. a multi-frame encoding algorithm) may be used to encode data stored in a plurality of physical programming units (a.k.a. fifth physical programming units) to generate a corresponding encoded data (a.k.a. a fifth encoded data). The fifth encoded data is configured to correct an error of the data stored in the fifth physical programming units. An algorithm for the single-frame encoding (a.k.a. a single-frame encoding algorithm) may be used to encode data stored in one single physical programming unit (a.k.a. a sixth physical programming unit) to generate an encoded data (a.k.a. a sixth encoded data). Further, the sixth encoded data is configured to correct an error of data stored in the sixth physical programming unit only. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or an XOR (exclusive OR) algorithm. Further, in another exemplary embodiment, more of other encoding algorithms not listed above may also be adopted, which are omitted herein. According to the adopted encoding algorithm, the error checking and correcting circuit 708 can encode the data to be protected, so as to generate the corresponding ECC and/or the EDC. For clear description, the ECC and/or the EDC generated by encoding are collectively referred to as encoded data. In particular, in the exemplary embodiments of the invention, the multi-frame encoding algorithm is also known as "a first algorithm", and the single-frame encoding algorithm is also known as "a second algorithm".

Figure 7:
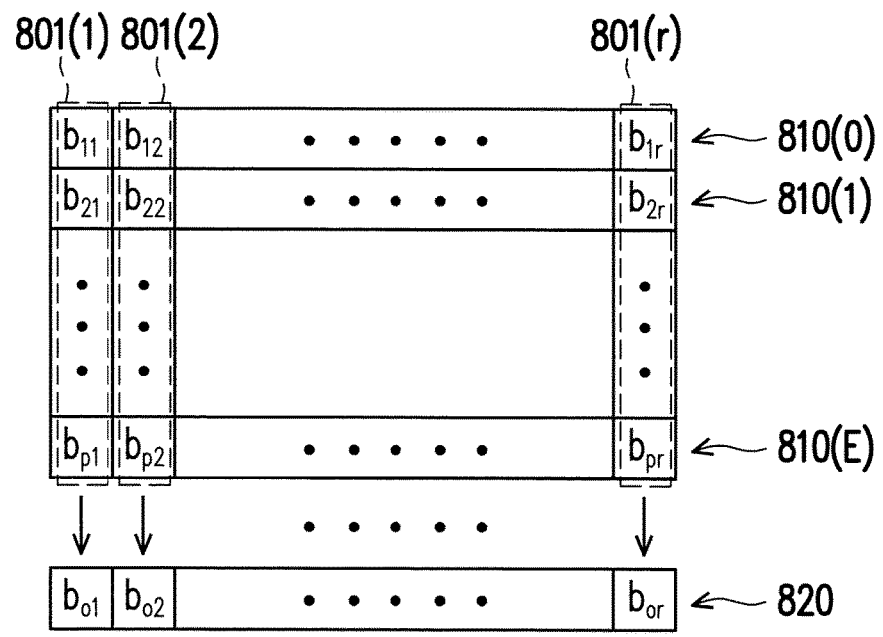
FIG. 7 is a schematic diagram illustrating a multi-frame encoding according to an exemplary embodiment of the invention.

FIG. 7 is a schematic diagram illustrating a multi-frame encoding according to an exemplary embodiment of the invention.

With reference to FIG. 7 that takes encoded data 820 correspondingly generated by encoding the data stored in physical programming units 810(0) to 810(E) as an example, in which at least a part of data stored by each of the physical programming units 810(0) to 810(E) may be regarded as one frame. In the multi-frame encoding, the data in the physical programming units 810(0) to 810(E) are encoded based on each of positions where bits (or bytes) are located. For example, bits $b_{11}$, $b_{21}$, . . . , $b_{p1}$ at a position 801(1) are encoded as a bit $b_{o1}$ in the encoded data 820 and bits $b_{12}$, $b_{22}$, . . . , $b_{p2}$ at a position 801(2) are encoded as a bit $b_{o2}$ in the encoded data 820; and by analogy, bits $b_{1r}$, $b_{2r}$, . . . , $b_{pr}$ at a position 801(r) are encoded as a bit $b_{or}$ in the encoded data 820. Later, the data read from the physical programming units 810(0) to 810(E) may be decoded according to the encoded data 820 so attempts on correcting possible errors in the read data can be made.

Herein, in another exemplary embodiment of FIG. 7, the data used for generating the encoded data 820 may also include redundancy bits corresponding to the data bits in the data stored in the physical programming units 810(0) to 810(E). Taking the data stored in the physical programming unit 810(0) for example, the redundancy bits therein are, for example, generated by performing the single-frame encoding for the data bits stored in the physical programming unit 810(0).

It should be noted that, due to different manufacturing processes, a probability of errors occurred (i.e., an error rate) in data stored by the memory cells on each word line in the rewritable non-volatile memory module 406 may be different. In the present exemplary embodiment, taking the memory cell array of FIG. 5B for example, the word lines 526(0) to 526(5) arranged according to the error rate of the data stored by the memory cells from greatest to least may be in the order of the word line 526(0), the word line 526(1), the word line 526(2), the word line 526(3), the word line 526(4) and the word line 526(5). Nonetheless, in another embodiment, the word lines 526(0) to 526(5) arranged according to the error rate of the data stored by the memory cells from greatest to least may also be in the order of the word line 526(5), the word line 526(4), the word line 526(3), the word line 526(2), the word line 526(1) and the word line 526(0). In particular, during the process of reading data from one word line, when the error occurs on the read data, it is required to read the corresponding encoded data and related data for generating the corresponding encoded data in order to conduct decoding so attempts on correcting the error existing in the current read data can be made. During the process of generating the decoded data, if one specific encoded data is generated all by using data with a lower error rate (e.g., the data in the memory cells in the word line 526(5)), a capability of an error checking and correcting of that specific encoded data is also higher. Relatively, during the process of generating the decoded data, if one specific encoded data is generated all by using data with a higher error rate (e.g., the data in the memory cells in the word line 526(0)), an capability of an error checking and correcting of that specific encoded data is also lower.

Based on the above, the invention proposes a data encoding method, which is capable of dividing the rewritable non-volatile memory module 406 into at least two areas. Each of the areas can generate the encoded data by using respective encoding methods of their own. Accordingly, the error checking and correcting capability of the encoded data for decoding the data in the word lines with the higher error rate (e.g., the word line 526(0)) may be improved.

It is noted that in the following description, some terms may be replaced with corresponding abbreviations for ease of reading (see Table 1).

TABLE 1

| rewritable non-volatile memory module | RNVM module |
|---|---|
| physical programming unit | PPU |
| memory management circuit | MMC |

Figure 8:
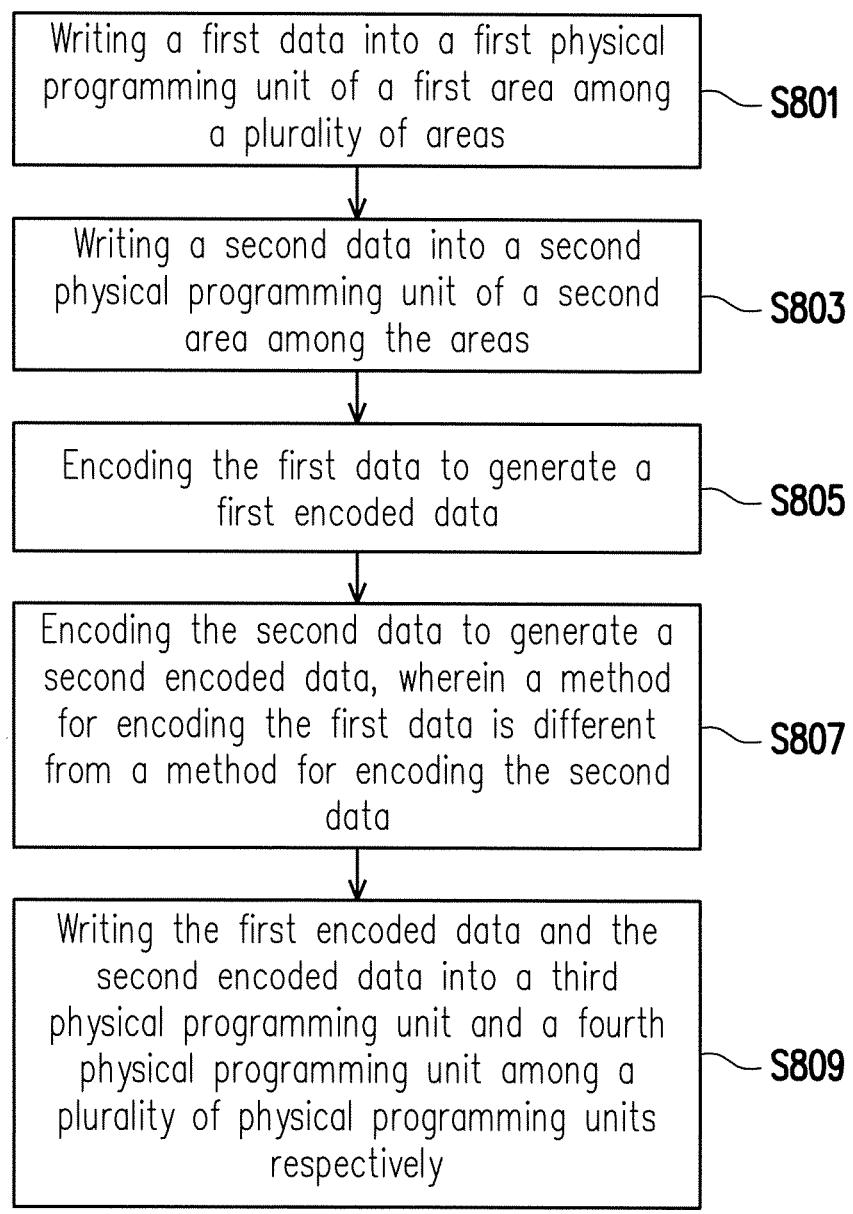
FIG. 8 is a flowchart illustrating a data encoding method according to an exemplary embodiment of the invention.

FIG. 8 is a flowchart illustrating a data encoding method according to an exemplary embodiment of the invention.

With reference to FIG. 8, in step S801, the MMC 702 writes a first data into a first PPU of a first area among a plurality of areas in the RNVM module 406. In step S803, the MMC 702 writes the second data into a second PPU of a second area among the areas in the RNVM module 406. In step S805, the MMC 702 encodes the first data to generate a first encoded data. In step S807, the MMC 702 encodes the second data to generate a second encoded data. Here, a method for encoding the first data is different from a method for encoding the second data. In step S809, the MMC 702 writes the first encoded data and the second encoded data into a third PPU and a fourth PPU among a plurality of PPUs respectively. In particular, a precedence of steps in FIG. 8 is not limited by the invention. In another embodiment, for example, the MMC 702 may also execute step S803 before executing step S801, or may also execute step S807 before executing step S805.

Multiple embodiments are below to describe the data encoding method of the invention in more details.

First Exemplary Embodiment

FIG. 9A and FIG. 9B are schematic diagrams illustrating data stored in each word line and a corresponding encoded data according to a first exemplary embodiment of the invention.

Referring to FIG. 9A and FIG. 9B together, in the present exemplary embodiment, it is assumed that the RNVM module 406 is the three-dimension (3D) NAND flash memory module constituted by the memory cell array of FIG. 5B, and the word lines 526(0) to 526(5) arranged according to the error rate of the data stored by the memory cells from greatest to least are in the order of the word line 526(0), the word line 526(1), the word line 526(2), the word line 526(3), the word line 526(4) and the word line 526(5). In the present exemplary embodiment, it is assumed that memory cells on each of the word lines in the RNVM module 406 are able to form six PPUs. As shown in FIG. 9A and FIG. 9B, PPUs P0(0) to P0(5) are formed by the memory cells on the word line 526(0); PPUs P1(0) to P1(5) are formed by the memory cells on the word line 526(1); PPUs P2(0) to P2(5) are formed by the memory cells on the word line 526(2); PPUs P3(0) to P3(5) are formed by the memory cells on the word line 526(3); PPUs P4(0) to P4(5) are formed by the memory cells on the word line 526(4); PPUs P5(0) to P5(5) are formed by the memory cells on the word line 526(5).

In particular, referring to FIG. 5B, FIG. 9A and FIG. 9B together, in the present exemplary embodiment, the MMC 702 sets up one word line (a.k.a. a third word line) among the word lines 526(0) to 526(5), and identifies the first area and the second area in the RNVM module 406 according to the third word line. Here, the first area includes a plurality of first word lines and the second area includes a plurality of second word lines. PPUs of the first area are formed by the memory cells on the first word lines and PPUs of the second area are formed by the memory cells on the second word lines.

In detail, it is assumed that the word line 526(2) is set by the MMC 702 as the third word line. Then, the MMC 702 can identify the word lines 526(0) to 526(1) (collectively referred to as fourth word lines) in a $Z_1$ direction (a.k.a. a first direction) corresponding to the word line 526(2) in FIG. 5B as the first word lines of the first area, and identify the word lines 526(3) to 526(5) (collectively referred to as fifth word lines) in a $Z_2$ direction (a.k.a. a second direction) corresponding to the word line 526(2) as the second word lines of the second area. It should be noted that, in the present exemplary embodiment, the MMC 702 also identifies (classifies) the third word line (i.e., the word line 526(2)) as the first word line of the first area. In other words, the third word line belongs to the first area instead of the second area. However, the invention is not limited to the above. In another embodiment, it is also possible that the third word line belongs to the second area instead of the first area.

It should be noted that, the third word line may be pre-determined before the memory storage device 10 leaves the factory, or may be dynamically determined during operations of the memory storage device 10. As shown in FIG. 9A and FIG. 9B, in the present exemplary embodiment, because the word lines 526(0) to 526(5) arranged according to the error rate of the data stored by the memory cells from greatest to least are in the order of the word line 526(0), the word line 526(1), the word line 526(2), the word line 526(3), the word line 526(4) and the word line 526(5) while the word line 526(0), the word line 526(1) and the word line 526(2) are classified as the first word lines of the first area, the error rate of the data stored in the PPUs P0(0) to P0(5) of the word line 526(0), the PPUs P1(0) to P1(5) of the word line 526(1) and the PPUs P2(0) to P2(5) of the word line 526(2) will be greater than a first error rate threshold. Also, because the word line 526(3), the word line 526(4) and the word line 526(5) are classified as the second word lines of the second area, the error rate of the data stored in the PPUs P0(0) to P0(5) of the word line 526(3), the PPUs P1(0) to P1(5) of the word line 526(4) and the PPUs P2(0) to P2(5) of the word line 526(5) will not be greater than the first error rate threshold. Here, the first error rate threshold is, for example, 20%.

In other words, during the process of determining the third word line, the third word line will be determined by using the first error rate threshold. More specifically, when the error rate of data stored in the PPU of one specific word line is greater than the first error rate threshold and the error rate of data stored in the PPU of another word line closest to the specific word line in the $Z_1$ direction (or in the $Z_2$ direction) is not greater than the first error rate threshold, the MMC 702 determines that the former is the third word line. In the present exemplary embodiment, because the error rate of the data stored in the PPUs P2(0) to P2(5) of the word line 526(2) is greater than the first error rate threshold and the error rate of the data stored in the PPUs P3(0) to P3(5) of the word line 526(3) closest to the word line 526(2) in the $Z_2$ direction of FIG. 5B is not greater than the first error rate threshold, the MMC 702 determines that the word line 526(2) is the third word line.

With reference to FIG. 9A and FIG. 9B, it is assumed that a first data is already being written into the PPUs on the word lines 526(0) to 526(2) by the MMC 702. The first data includes sub-data A_0 to A_14. Here, the sub-data A_0 to A_4 are respectively written into the PPUs P0(0) to P0(4) of the word line 526(0); the sub-data A_5 to A_9 are respectively written into the PPUs P1(0) to P1(4) of the word line 526(1); the sub-data A_10 to A_14 are respectively written into the PPUs P2(0) to P2(4) of the word line 526(2).

In particular, in the present exemplary embodiment, the MMC 702 encodes each of the sub-data A_0 to A_14 by using the single-frame encoding algorithm, and stores an encoded data generated after the encoding (hereinafter referred to as a single-frame encoded data) and the corresponding sub-data into the same PPU. For instance, the MMC 702 encodes the sub-data A_0 by using the single-frame encoding algorithm to generate the single-frame encoded data (not shown) corresponding to the sub-data A_0, and stores the single-frame encoded data corresponding to the sub-data A_0 together with the sub-data A_0 into the PPU P0(0). The single-frame encoded data corresponding to the sub-data A_0 is configured to correct the error of the data stored in the PPU P0(0). Similarly, the MMC 702 encodes the sub-data Ai to A_14 by using the single-frame encoding algorithm to generate the single-frame encoded data (not shown) corresponding to the sub-data A_1 to A_14, and stores the single-frame encoded data corresponding to the sub-data A_1 to A_14 into the PPUs P0(1) to P0(4), the PPUs P1(0) to P1(4) and the PPUs P2(0) to P2(4), respectively. Here, the single-frame encoded data corresponding to the sub-data A_1 is configured to correct the error of the data stored in the PPU P0(1), the single-frame encoded data corresponding to the sub-data A_2 is configured to correct the error of the data stored in the PPU P0(2), and so on. Here, the single-frame encoded data corresponding to the sub-data A_0 to A_14 are collectively referred to as "a third encoded data".

Further, it is assumed that a second data is already being written into the PPUs on the word lines 526(3) to 526(5) by the MMC 702. The second data includes sub-data B_0 to B_14. Here, the sub-data B_0 to B_4 are respectively written into the PPUs P3(0) to P3(4) of the word line 526(3); the sub-data B_5 to B_9 are respectively written into the PPUs P4(0) to P4(4) of the word line 526(4); the sub-data B_10 to B_14 are respectively written into the PPUs P5(0) to P5(4) of the word line 526(5).

In particular, in the present exemplary embodiment, the MMC 702 encodes each of the sub-data B_0 to B_14 by using the single-frame encoding algorithm, and stores an encoded data generated after the encoding (hereinafter referred to as a single-frame encoded data) and the corresponding sub-data into the same PPU. For instance, the MMC 702 encodes the sub-data B_0 by using the single-frame encoding algorithm to generate the single-frame encoded data (not shown) corresponding to the sub-data B_0, and stores the single-frame encoded data corresponding to the sub-data B_0 together with the sub-data B_0 into the PPU P3(0). The single-frame encoded data corresponding to the sub-data B_0 is configured to correct the error of the data stored in the PPU P3(0). Similarly, the MMC 702 encodes the sub-data B_1 to B_14 by using the single-frame encoding algorithm to generate the single-frame encoded data (not shown) corresponding to the sub-data B_1 to B_14, and stores the single-frame encoded data corresponding to the sub-data B_1 to B_14 into the PPUs P3(1) to P3(4), the PPUs P4(0) to P4(4) and the PPUs P5(0) to P5(4), respectively. Here, the single-frame encoded data corresponding to the sub-data B_1 is configured to correct the error of the data stored in the PPU P3(1), the single-frame encoded data corresponding to the sub-data B_2 is configured to correct the error of the data stored in the PPU P3(2), and so on. Here, the single-frame encoded data corresponding to the sub-data B_0 to B_14 are collectively referred to as "a fourth encoded data".

In the data encoding method of the invention, the MMC 702 further generates the encoded data for error checking and correcting for the word lines 526(0) to 526(2) in the first area by using the multi-frame encoding algorithm. Specifically, the MMC 702 encodes the sub-data A_0, the sub-data A_1, the sub-data A_2, the sub-data A_3 and the sub-data A_4 by using the multi-frame encoding algorithm to generate an encoded data RS0. The MMC 702 writes the encoded data RS0 into the PPU P0(5) of the word line 526(0).

Similarly, the MMC 702 encodes the sub-data A_5, the sub-data A_6, the sub-data A_7, the sub-data A_8 and the sub-data A_9 to generate an encoded data RS1. The MMC 702 writes the encoded data RS1 into the PPU P1(5) of the word line 526(1).

Similarly, the MMC 702 encodes the sub-data A_10, the sub-data A_11, the sub-data A_12, the sub-data A_13 and the sub-data A_14 to generate an encoded data RS2. The MMC 702 writes the encoded data RS2 into the PPU P2(5) of the word line 526(2).

In particular, the encoded data RS0 to RS2 may be referred to as "the first encoded data". The PPU P0(5), the PPU P1(5) and the PPU P2(5) may be referred to as "a third PPU".

In the data encoding method of the invention, the MMC 702 further generates the encoded data for error checking and correcting for the word lines 526(3) to 526(5) in the second area by using the multi-frame encoding algorithm. Specifically, the MMC 702 encodes the sub-data B_0, the sub-data B_1, the sub-data B_2, the sub-data B_3, the sub-data B_4, the sub-data A_0 and the sub-data A_1 to generate an encoded data RS3. The MMC 702 writes the encoded data RS3 into the PPU P3(5) of the word line 526(3).

Similarly, the MMC 702 encodes the sub-data B_5, the sub-data B_6, the sub-data B_7, the sub-data B_8, the sub-data B_9, the sub-data A_5 and the sub-data A_6 to generate an encoded data RS4. The MMC 702 writes the encoded data RS4 into the PPU P4(5) of the word line 526(4).

Similarly, the MMC 702 encodes the sub-data B_10, the sub-data B_11, the sub-data B_12, the sub-data B_13, the sub-data B_14, the sub-data A_10 and the sub-data A_11 to generate an encoded data RS5. The MMC 702 writes the encoded data RS5 into the PPU P5(5) of the word line 526(5).

In other words, the data encoding method of the first area is different from the data encoding method of the second area. For the word line 526(0) of the first area, the encoded data RS0 is simply generated by encoding by using the sub-data A_0 to A_4.

The encoded data RS0 is configured to correct the error of the data stored in one PPU among the PPUs P0(0) to P0(4) of the word line 526(0).

However, as for the word line 526(3) of the second area, the encoded data RS3 is generated by encoding by using the sub-data B_0 to B_4 and the sub-data A_0 to A_1. The encoded data RS3 may be used to correct one PPU among the PPUs P3(0) to P3(4) of the word line 526(3), or correct the error of the data stored in one PPU among the PPUs P0(0) and P0(1) of the word line 526(0).

In other words, the encoded data RS0 to RS2 corresponding to the first area are generated simply according to the sub-data A_0 to A_14 stored in the first area, that is, the encoded data RS0 to RS2 are not generated according the sub-data B_0 to B_14 stored in the second area. Moreover, the encoded data RS3 to RS5 corresponding to the second area are generated according to the sub-data A_0 to A_14 stored in the first area and the sub-data B_0 to B_14 stored in the second area. In the above encoding approach, given that the error rate of the data stored in the first area may be greater, other than being configured to decode the data stored in the second area for error checking and correcting, the encoded data of the second area may also be used to decode a part of the data stored in the first area for error checking and correcting. Accordingly, a decoding success rate of the data stored in the first area with the higher error rate may be increased.

In an example where the encoded data RS0 is used for decoding, in an embodiment, the MMC 702 may first decode the data stored in the PPUs P0(0) to P0(4) by using the encoded data RS0 of the first area so as to correct the errors of the data stored in the PPUs P0(0) to P0(4). When the errors of the data stored in the PPUs P0(0) to P0(4) are uncorrectable by using the encoded data RS0, the encoded data RS3 may then be used for decoding again to correct the error of the data stored in the PPUs P0(0) and P0(1) among the PPUs P0(0) to P0(4) such that the decoding success rate may be increased.

In particular, the encoded data RS3 to RS5 may be referred to as "the second encoded data". The PPU P3(5), the PPU P4(5) and the PPU P5(5) may be referred to as "the fourth PPU". The sub-data A_0 and A_1, the sub-data A_5 and A_6 and the sub-data A_10 and A_11 may be referred to as "a first sub-data".

It should be noted that, in the present exemplary embodiment, the encoded data RS3 is generated by encoding sub-data B_0 to B_4 stored in the word line 526(3) and the two sub-data (i.e., the sub-data A_0 and A_1) stored in the word line 526(0). Nonetheless, in other embodiments, the encoded data RS3 may also be generating by encoding sub-data selected from the other word lines (or the other PPUs) in the first area. Further, the number of sub-data used for encoding as selected from the first area for generating the encoded data RS3 is not limited by the invention. Similarly, the encoded data RS4 and RS5 may also came from any word lines selected from the first area, and generated by encoding the sub-data chosen from the selected word line from the first area. Further, the number of sub-data used for encoding as selected from the first area for generating the encoded data RS4 and RS5 is not limited by the invention.

In particular, in an exemplary embodiment, the MMC 702 can preferentially select the data stored in the word line with a greatest error rate (e.g., the word line 526(0)) and the data stored in the word line with a smallest error rate (e.g., the word line 526(5)) for the multi-frame encoding, and then select the data stored in the word line with a second-greatest error rate (e.g., the word line 526(1)) and the data stored in the word line with a second-smallest error rate (e.g., the word line 526(7)) for the multi-frame encoding, and so on. Accordingly, the decoding success rate of the data stored in the first area with the higher error rate may be further increased.

Figure 10:
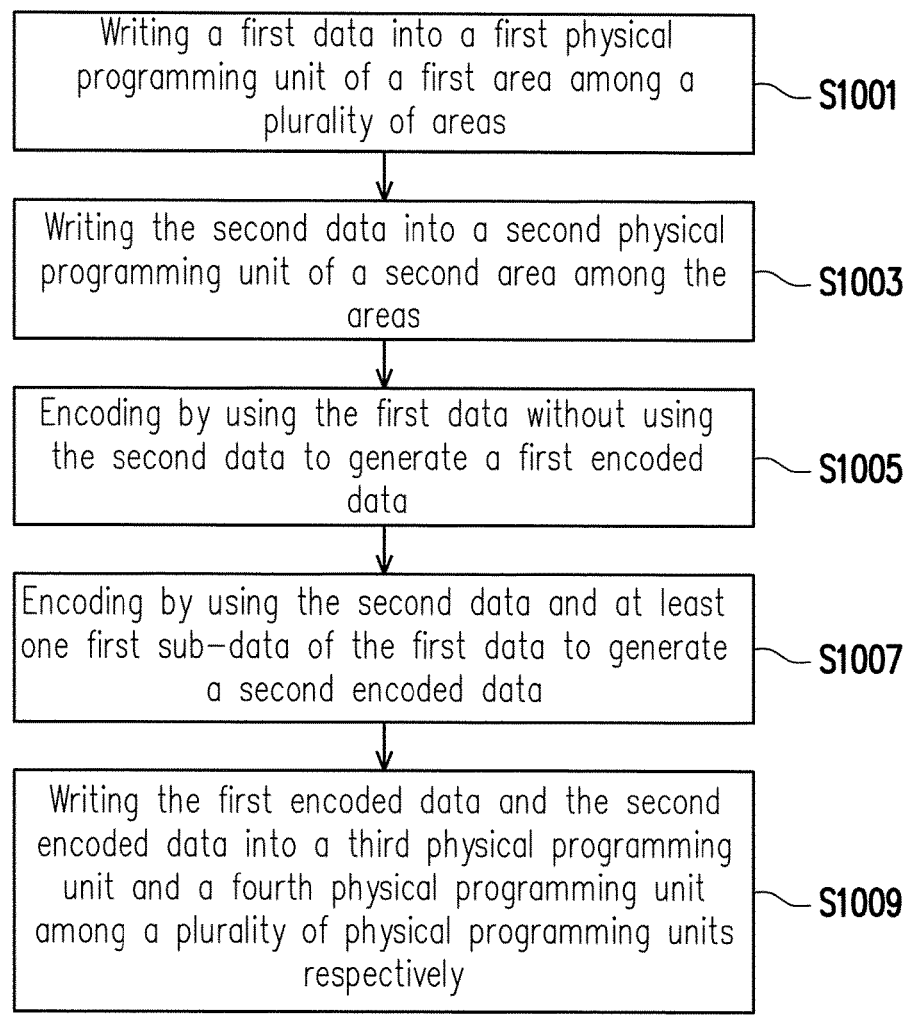
FIG. 10 is a flowchart illustrating a data encoding method according to the first exemplary embodiment of the invention.

FIG. 10 is a flowchart illustrating a data encoding method according to the first exemplary embodiment of the invention.

With reference to FIG. 10, in step S1001, the MMC 702 writes a first data into a first PPU of a first area among a plurality of areas of the RNVM module 406. In step S1003, the MMC 702 writes the second data into a second PPU of a second area among the areas in the RNVM module 406. In step S1005, the MMC 702 encodes by using the first data without using the second data to generate a first encoded data. In step S1007, the MMC 702 encodes by using the second data and at least one first sub-data of the first data to generate a second encoded data. In step S1009, the MMC 702 writes the first encoded data and the second encoded data into a third PPU and a fourth PPU among a plurality of PPUs respectively. In particular, a precedence of steps in FIG. 10 is not limited by the invention. In another embodiment, for example, the MMC 702 may also execute step S1003 before executing step S1001, or may also execute step S1007 before executing step S1005.

In the encoding approach of the first exemplary embodiment, given that the error rate of the data stored in each of the PPUs of the first area is greater than the error rate of the data stored in each of the PPUs of the second area, other than being configured to decode the data stored in the second area for error checking and correcting, the encoded data of the second area generated by using the multi-frame encoding algorithm may also be used to decode the data stored in the first area for error checking and correcting. Accordingly, a decoding success rate of the data stored in the first area with the higher error rate may be increased.

Second Exemplary Embodiment

Figure 11A:
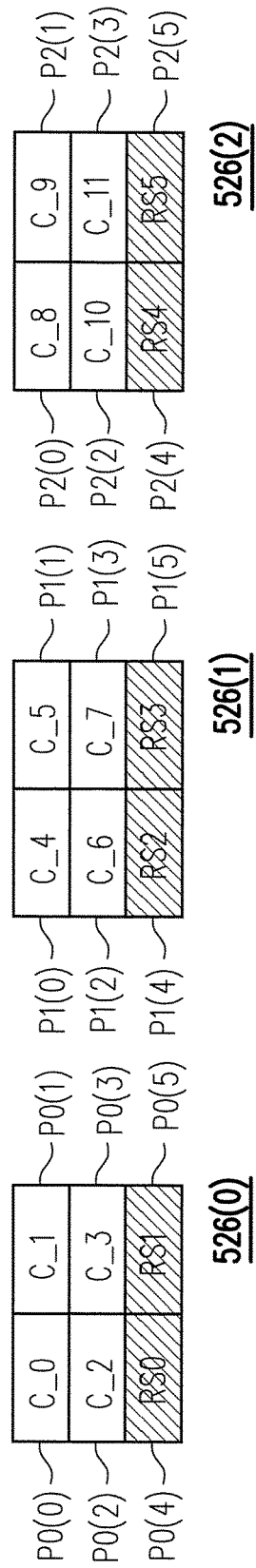
FIG. 11A and FIG. 11B are schematic diagrams illustrating data stored in each word line and a corresponding encoded data according to second and third exemplary embodiments of the invention.
Figure 11B:
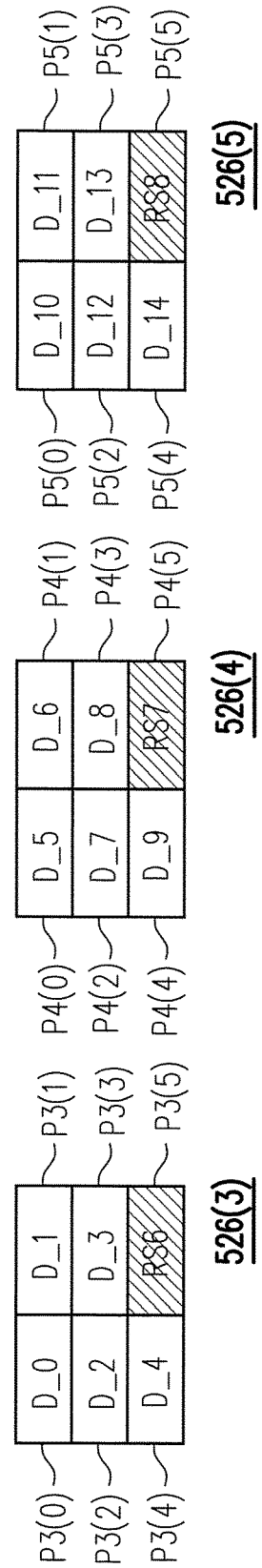

FIG. 11A and FIG. 11B are schematic diagrams illustrating data stored in each word line and a corresponding encoded data according to second and third exemplary embodiments of the invention.

With reference to FIG. 11A and FIG. 11B, which are similar to FIG. 9A and FIG. 9B, in the present exemplary embodiment, it is assumed that the RNVM module 406 is the 3D NAND flash memory module constituted by the memory cell array of FIG. 5B, and the word lines 526(0) to 526(5) arranged according to the error rate of the data stored by the memory cells from greatest to least are in the order of the word line 526(0), the word line 526(1), the word line 526(2), the word line 526(3), the word line 526(4) and the word line 526(5). In the present exemplary embodiment, PPUs P0(0) to P0(5) are formed by the memory cells on the word line 526(0); PPUs P1(0) to P1(5) are formed by the memory cells on the word line 526(1); PPUs P2(0) to P2(5) are formed by the memory cells on the word line 526(2); PPUs P3(0) to P3(5) are formed by the memory cells on the word line 526(3); PPUs P4(0) to P4(5) are formed by the memory cells on the word line 526(4); PPUs P5(0) to P5(5) are formed by the memory cells on the word line 526(5).

In addition, it is assumed herein that the word line 526(2) is set as aforementioned third word line. According to the third word line, the MMC 702 identifies the word line 526(0), the word line 526(1) and the word line 526(2) as the first word lines of the first area, and identifies the word line 526(3), the word line 526(4) and the word line 526(5) as the second word lines of the second area. The method for determining the third word line is already described detail above, and is thus not repeated hereinafter.

It is assumed herein that a first data is already being written into the PPUs on the word lines 526(0) to 526(2) by the MMC 702. In the second exemplary embodiment, it is assumed that the first data includes sub-data C_0 to C_11. Here, the sub-data C_0 to C_3 are respectively written into the PPUs P0(0) to P0(3) of the word line 526(0); the sub-data C_4 to C_7 are respectively written into the PPUs P1(0) to P1(3) of the word line 526(1); the sub-data C_8 to C_11 are respectively written into the PPUs P2(0) to P2(3) of the word line 526(2).

In particular, in the present exemplary embodiment, the MMC 702 further encodes each of the sub-data C_0 to C_11 by using the single-frame encoding algorithm, and stores an encoded data generated after the encoding (hereinafter referred to as a single-frame encoded data) and the corresponding sub-data into the same PPU. For instance, the MMC 702 encodes the sub-data C_0 by using the single-frame encoding algorithm to generate the single-frame encoded data (not shown) corresponding to the sub-data C_0, and stores the single-frame encoded data corresponding to the sub-data C_0 together with the sub-data C_0 into the PPU P0(0). The single-frame encoded data corresponding to the sub-data C_0 is configured to correct the error of the data stored in the PPU P0(0). Similarly, the MMC 702 encodes the sub-data C_1 to C_11 by using the single-frame encoding algorithm to generate the single-frame encoded data (not shown) corresponding to the sub-data C_1 to C_11, and stores the single-frame encoded data corresponding to the sub-data C_1 to C_11 into the PPUs P0(1) to P0(3), the PPUs P1(0) to P1(3) and the PPUs P2(0) to P2(3), respectively. Here, the single-frame encoded data corresponding to the sub-data C_1 is configured to correct the error of the data stored in the PPU P0(1), the single-frame encoded data corresponding to the sub-data C_2 is configured to correct the error of the data stored in the PPU P0(2), and so on.

Further, it is assumed that a second data is already being written into the PPUs on the word lines 526(3) to 526(5) by the MMC 702. The second data includes sub-data D_0 to D_14. Here, the sub-data D_0 to D_4 are respectively written into the PPUs P3(3) to P3(4) of the word line 526(3); the sub-data D_5 to D_9 are respectively written into the PPUs P4(0) to P4(4) of the word line 526(4); the sub-data D_10 to D_14 are respectively written into the PPUs P5(0) to P5(4) of the word line 526(5).

In particular, in the present exemplary embodiment, the MMC 702 further encodes each of the sub-data D_0 to D_14 by using the single-frame encoding algorithm, and stores an encoded data generated after the encoding (hereinafter referred to as a single-frame encoded data) and the corresponding sub-data into the same PPU. For instance, the MMC 702 encodes the sub-data D_0 by using the single-frame encoding algorithm to generate the single-frame encoded data (not shown) corresponding to the sub-data D_0, and stores the single-frame encoded data corresponding to the sub-data D_0 together with the sub-data D_0 into the PPU P3(0). The single-frame encoded data corresponding to the sub-data D_0 is configured to correct the error of the data stored in the PPU P3(0). Similarly, the MMC 702 encodes the sub-data D_1 to D_14 by using the single-frame encoding algorithm to generate the single-frame encoded data (not shown) corresponding to the sub-data D_1 to D_14, and stores the single-frame encoded data corresponding to the sub-data D_1 to D_14 into the PPUs P3(1) to P3(4), the PPUs P4(0) to P4(4) and the PPUs P5(0) to P5(4), respectively. Here, the single-frame encoded data corresponding to the sub-data D_1 is configured to correct the error of the data stored in the PPU P3(1), the single-frame encoded data corresponding to the sub-data D_2 is configured to correct the error of the data stored in the PPU P3(2), and so on.

In the second exemplary embodiment of the invention, the MMC 702 further generates the encoded data for error checking and correcting for the word lines 526(0) to 526(2) in the first area by using the multi-frame encoding algorithm. In detail, the MMC 702 encodes the sub-data C_0 and the sub-data C_2 by using the multi-frame encoding algorithm to generate an encoded data RS0. The MMC 702 writes the encoded data RS0 into the PPU P0(4) of the word line 526(0). The MMC 702 encodes the sub-data C_1 and the sub-data C_3 by using the multi-frame encoding algorithm to generate an encoded data RS1. The MMC 702 writes the encoded data RS1 into the PPU P0(5) of the word line 526(0).

Similarly, the MMC 702 encodes the sub-data C_4 and the sub-data C_6 by using the multi-frame encoding algorithm to an encoded data RS2. The MMC 702 writes the encoded data RS2 into the PPU P1(4) of the word line 526(1). The MMC 702 encodes the sub-data C_5 and the sub-data C_7 by using the multi-frame encoding algorithm to generate an encoded data RS3. The MMC 702 writes the encoded data RS3 into the PPU P1(5) of the word line 526(1).

Similarly, the MMC 702 encodes the sub-data C_8 and the sub-data C_10 by using the multi-frame encoding algorithm to generate an encoded data RS4. The MMC 702 writes the encoded data RS4 into the PPU P2(4) of the word line 526(2). The MMC 702 encodes the sub-data C_9 and the sub-data C_11 by using the multi-frame encoding algorithm to generate an encoded data RS5. The MMC 702 writes the encoded data RS5 into the PPU P2(5) of the word line 526(2).

In the data encoding method of the invention, the MMC 702 further generates the encoded data for error checking and correcting for the word lines 526(3) to 526(5) in the second area by using the multi-frame encoding algorithm. Specifically, the MMC 702 encodes the sub-data D_0, the sub-data D_1, the sub-data D_2, the sub-data D_3 and the sub-data D_4 by using the multi-frame encoding algorithm to generate an encoded data RS6. The MMC 702 writes the encoded data RS6 into the PPU P3(5) of the word line 526(3).

Similarly, the MMC 702 encodes the sub-data D_5, the sub-data D_6, the sub-data D_7, the sub-data D_8 and the sub-data D_9 to generate an encoded data RS7. The MMC 702 writes the encoded data RS7 into the PPU P4(5) of the word line 526(4).

Similarly, the MMC 702 encodes the sub-data D_10, the sub-data D_11, the sub-data D_12, the sub-data D_13 and the sub-data D_14 to generate an encoded data RS8. The MMC 702 writes the encoded data RS8 into the PPU P5(5) of the word line 526(5).

In other words, the data encoding method of the first area is different from the data encoding method of the second area. Specifically, each encoded data generated by using the multi-frame encoding algorithm in the first area is generated by encoding by using two (a.k.a. a fourth number of) sub-data (a.k.a. a fourth sub-data), and each encoded data generated by using the multi-frame encoding algorithm in the second area is generated by encoding by using five (a.k.a. a fifth number of) sub-data (a.k.a. a fifth sub-data). In general, during the process of encoding the sub-data by using the multi-frame encoding algorithm, if sizes of the sub-data for encoding are identical, an error correcting capability of the encoded data generated by encoding by using a less number of the sub-data will be better than an error correcting capability of the encoded data generated by encoding by using a greater number of the sub-data. Therefore, when the encoded data RS0 to RS5 of the first area are generated by a less number of the sub-data, the error detecting and correcting ability of the encoded data RS0 to RS5 for the data stored in the first area can be improved accordingly.

Figure 12:
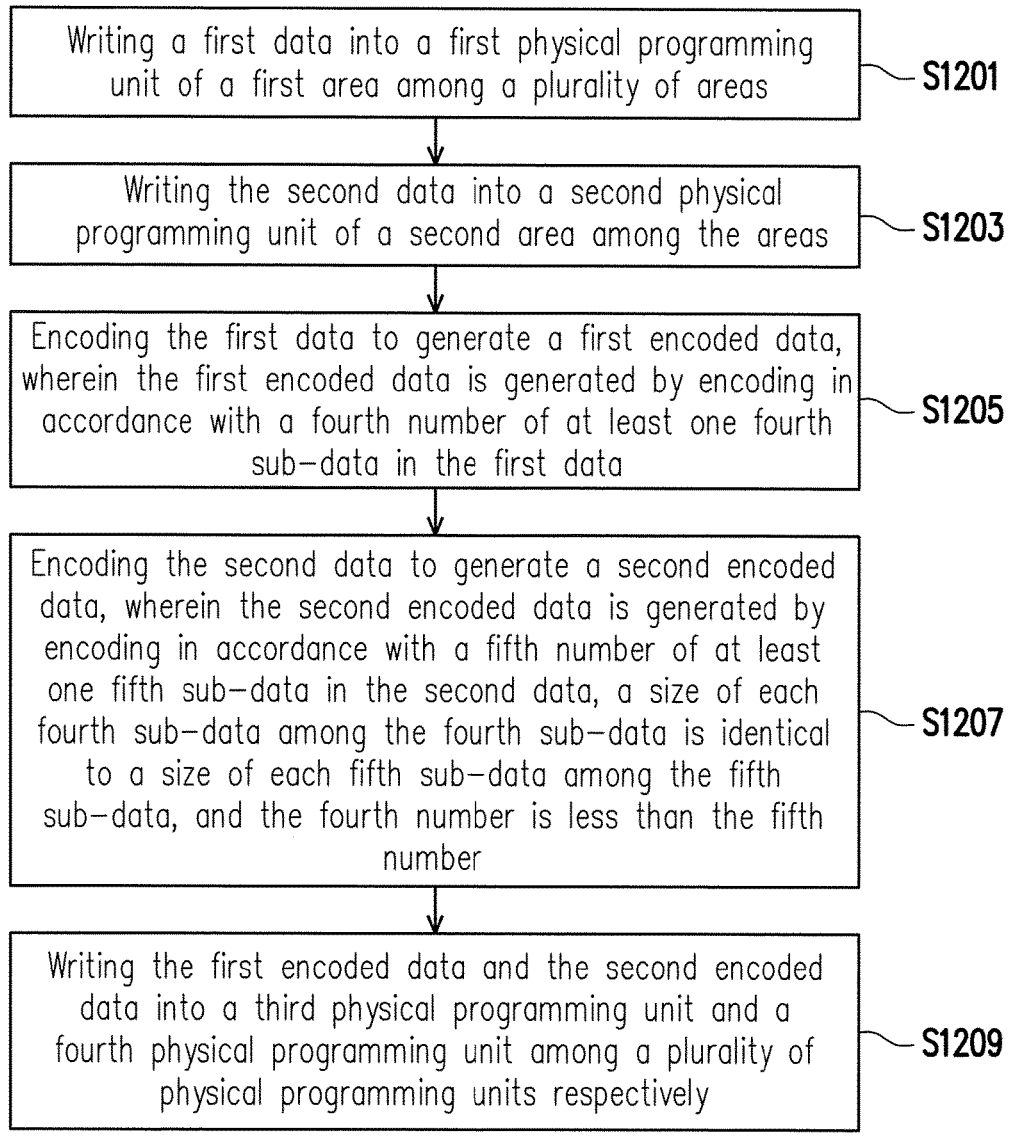
FIG. 12 is a flowchart illustrating a data encoding method according to the second exemplary embodiment of the invention.

FIG. 12 is a flowchart illustrating a data encoding method according to the second exemplary embodiment of the invention.

With reference to FIG. 12, in step S1201, the MMC 702 writes a first data into a first PPU of a first area among a plurality of areas of the RNVM module 406. In step S1203, the MMC 702 writes the second data into a second PPU of a second area among the areas in the RNVM module 406. In step S1205, the MMC 702 encodes the first data to generate a first encoded data. Here, the first encoded data is generated by encoding in accordance with a fourth number of at least one fourth sub-data in the first data. In step S1207, the MMC 702 encodes the second data to generate a second encoded data. Here, the second encoded data is generated by encoding in accordance with a fifth number of at least one fifth sub-data in the second data, a size of each fourth sub-data among the fourth sub-data is identical to a size of each fifth sub-data among the fifth sub-data, and the fourth number is less than the fifth number. In step S1209, the MMC 702 writes the first encoded data and the second encoded data into a third PPU and a fourth PPU among a plurality of PPUs respectively. In particular, a precedence of steps in FIG. 10 is not limited by the invention. In another embodiment, for example, the MMC 702 may also execute step S1203 before executing step S1201, or may also execute step S1207 before executing step S1205.

Based on the above, given that the error rate of the data stored in the first area is greater, when the encoded data of the first area are generated by less number of the sub-data, the error detecting and correcting ability of the encoded data for the data stored in the first area can be improved accordingly.

Third Exemplary Embodiment

A data encoding method of the third exemplary embodiment of the invention is a combination of the data encoding method of the first exemplary embodiment and the data encoding method of the second exemplary embodiment. In detail, with reference to FIG. 11A and FIG. 11B, which are similar to FIG. 9A and FIG. 9B, in the present exemplary embodiment, it assumed that the word lines 526(0) to 526(5) of the RNVM module 406 arranged according to the error rate of the data stored by the memory cells from greatest are in the order of the word line 526(0), the word line 526(1), the word line 526(2), the word line 526(3), the word line 526(4) and the word line 526(5). As identical to the foregoing examples, it is assumed herein that the word line 526(2) is set as aforementioned third word line. According to the third word line, the MMC 702 identifies the word lines 526(0) to 526(2) as the first word lines of the first area, and identifies the word lines 526(3) to 526(5) as the second word lines of the second area. The method for determining the third word line is already described detail above, and is thus not repeated hereinafter.

It is assumed herein that a first data is already being written into the PPUs on the word lines 526(0) to 526(2) by the MMC 702. In the third exemplary embodiment, it is assumed that the first data includes sub-data C_0 to C_11. Here, the sub-data C_0 to C_3 are respectively written into the PPUs P0(0) to P0(3) of the word line 526(0); the sub-data C_4 to C_7 are respectively written into the PPUs P1(0) to P1(3) of the word line 526(1); the sub-data C_8 to C_11 are respectively written into the PPUs P2(0) to P2(3) of the word line 526(2).

As similar to the second exemplary embodiment, in the present exemplary embodiment, the MMC 702 further encodes each of the sub-data C_0 to C_11 by using the single-frame encoding algorithm, stores an encoded data generated after the encoding (hereinafter referred to as a single-frame encoded data) and the corresponding sub-data into the same PPU. For instance, the MMC 702 encodes the sub-data C_0 by using the single-frame encoding algorithm to generate the single-frame encoded data (not shown) corresponding to the sub-data C_0, and stores the single-frame encoded data corresponding to the sub-data C_0 together with the sub-data C_0 into the PPU P0(0). The single-frame encoded data corresponding to the sub-data C_0 is configured to correct the error of the data stored in the PPU P0(0). Similarly, the MMC 702 encodes the sub-data C_1 to C_11 by using the single-frame encoding algorithm to generate the single-frame encoded data (not shown) corresponding to the sub-data C_1 to C_11, and stores the single-frame encoded data corresponding to the sub-data C_1 to C_11 into the PPUs P0(1) to P0(3), the PPUs P1(0) to P1(3) and the PPUs P2(0) to P2(3), respectively. Here, the single-frame encoded data corresponding to the sub-data C_1 is configured to correct the error of the data stored in the PPU P0(1), the single-frame encoded data corresponding to the sub-data C_2 is configured to correct the error of the data stored in the PPU P0(2), and so on.

Further, it is assumed that a second data is already being written into the PPUs on the word lines 526(3) to 526(5) by the MMC 702. The second data includes sub-data D_0 to D_14. Here, the sub-data D_0 to D_4 are respectively written into the PPUs P3(3) to P3(4) of the word line 526(3); the sub-data D_5 to D_9 are respectively written into the PPUs P4(0) to P4(4) of the word line 526(4); the sub-data D_10 to D_14 are respectively written into the PPUs P5(0) to P5(4) of the word line 526(5).

As similar to the second exemplary embodiment, in the present exemplary embodiment, the MMC 702 further encodes each of the sub-data D_0 to D_14 by using the single-frame encoding algorithm, stores an encoded data generated after the encoding (hereinafter referred to as a single-frame encoded data) and the corresponding sub-data into the same PPU. For instance, the MMC 702 encodes the sub-data D_0 by using the single-frame encoding algorithm to generate the single-frame encoded data (not shown) corresponding to the sub-data D_0, and stores the single-frame encoded data corresponding to the sub-data D_0 together with the sub-data D_0 into the PPU P3(0). The single-frame encoded data corresponding to the sub-data D_0 is configured to correct the error of the data stored in the PPU P3(0). Similarly, the MMC 702 encodes the sub-data D_1 to D_14 by using the single-frame encoding algorithm to generate the single-frame encoded data (not shown) corresponding to the sub-data D_1 to D_14, and stores the single-frame encoded data corresponding to the sub-data D_1 to D_14 into the PPUs P3(1) to P3(4), the PPUs P4(0) to P4(4) and the PPUs P5(0) to P5(4), respectively. Here, the single-frame encoded data corresponding to the sub-data D_1 is configured to correct the error of the data stored in the PPU P3(1), the single-frame encoded data corresponding to the sub-data D_2 is configured to correct the error of the data stored in the PPU P3(2), and so on.

In the third exemplary embodiment of the invention, the MMC 702 further generates the encoded data for error checking and correcting for the word lines 526(0) to 526(2) in the first area by using the multi-frame encoding algorithm. In detail, the MMC 702 encodes the sub-data C_0 and the sub-data C_2 by using the multi-frame encoding algorithm to generate an encoded data RS0. The MMC 702 writes the encoded data RS0 into the PPU P0(4) of the word line 526(0). The MMC 702 encodes the sub-data C_1 and the sub-data C_3 by using the multi-frame encoding algorithm to generate an encoded data RS1. The MMC 702 writes the encoded data RS1 into the PPU P0(5) of the word line 526(0).

Similarly, the MMC 702 encodes the sub-data C_4 and the sub-data C_6 by using the multi-frame encoding algorithm to generate an encoded data RS2. The MMC 702 writes the encoded data RS2 into the PPU P1(4) of the word line 526(1). The MMC 702 encodes the sub-data C_5 and the sub-data C_7 by using the multi-frame encoding algorithm to generate an encoded data RS3. The MMC 702 writes the encoded data RS3 into the PPU P1(5) of the word line 526(1).

Similarly, the MMC 702 encodes the sub-data C_8 and the sub-data C_10 by using the multi-frame encoding algorithm to generate an encoded data RS4. The MMC 702 writes the encoded data RS4 into the PPU P2(4) of the word line 526(2). The MMC 702 encodes the sub-data C_9 and the sub-data C_11 by using the multi-frame encoding algorithm to generate an encoded data RS5. The MMC 702 writes the encoded data RS5 into the PPU P2(5) of the word line 526(2).

In the data encoding method of the invention, the MMC 702 further generates the encoded data for error checking and correcting for the word lines 526(3) to 526(5) in the second area by using the multi-frame encoding algorithm. Specifically, the MMC 702 encodes the sub-data D_0, the sub-data D_1, the sub-data D_2, the sub-data D_3, the sub-data D_4, the sub-data C_0 and the sub-data C_1 to generate an encoded data RS6. The MMC 702 writes the encoded data RS6 into the PPU P3(5) of the word line 526(3).

Similarly, the MMC 702 encodes the sub-data D_5, the sub-data D_6, the sub-data D_7, the sub-data D_8, the sub-data D_9, the sub-data C_4 and the sub-data C_5 to generate an encoded data RS7. The MMC 702 writes the encoded data RS7 into the PPU P4(5) of the word line 526(4).

Similarly, the MMC 702 encodes the sub-data D_10, the sub-data D_11, the sub-data D_12, the sub-data D_13, the sub-data D_14, the sub-data C_8 and the sub-data C_9 to generate an encoded data RS8. The MMC 702 writes the encoded data RS8 into the PPU P5(5) of the word line 526(5).

In the third exemplary embodiment, the sub-data C_0, the sub-data C_1, the sub-data C_4, the sub-data C_5, the sub-data C_8 and the sub-data C_9 may be referred to as "the first sub-data".

It should be noted that, in the present exemplary embodiment, taking the encoded data RS6 for example, the encoded data RS6 is generated by encoding by using sub-data D_0 to D_4 stored in the word line 526(3) and the two sub-data (i.e., the sub-data C_0 and C_1) stored in the word line 526(0). Nonetheless, in other embodiments, the encoded data RS6 may also be generating by encoding a specific number of sub-data selected from the other word lines (or the other PPUs) in the first area. Similarly, the encoded data RS7 and RS8 may also came from any word lines selected from the first area, and generated by encoding by choosing any number of the sub-data from the selected word line from the first area.

In particular, in an exemplary embodiment, the MMC 702 can preferentially select the data stored in the word line with a greatest error rate (e.g., the word line 526(0)) and the data stored in the word line with a smallest error rate (e.g., the word line 526(5)) for the multi-frame encoding, and then select the data stored in the word line with a second-greatest error rate (e.g., the word line 526(1)) and the data stored in the word line with a second-smallest error rate (e.g., the word line 526(7)) for the multi-frame encoding, and so on. Accordingly, the decoding success rate of the data stored in the first area with the higher error rate may be further increased.

Based on the data encoding method of the third exemplary embodiment, given that the error rate of the data stored in the word lines 526(0) to 526(2) is higher, when the encoded data RS0 to RS5 of the first area are generated by a less number of the sub-data, the error detecting and correcting ability of the encoded data RS0 to RS5 for the data stored in the first area can be improved accordingly. Moreover, for the encoded data RS6 to RS8 of the second area, the encoded data RS6 to RS8 are generated according to a part of the sub-data stored in the first area and a part of the sub-data stored in the second area. Accordingly, other than being configured to decode the data stored in the second area for error checking and correcting, the encoded data RS6 to RS8 of the second area may also be used to decode the part of the data stored in the first area for error checking and correcting. Based on the above, the decoding success rate of the data stored in the first area with the higher error rate may be effectively increased.

For example, the MMC 702 can first decode the PPU P0(0) and the PPU P0(2) by using the encoded data RS0 of the first area so as to correct the errors of the data stored in the PPU P0(0) and the PPU P0(2). When the errors of the data stored in the PPUs P0(0) and the PPU P0(2) are uncorrectable by using the encoded data RS0, the encoded data RS6 may be used for decoding to correct the error of the data stored in the PPU P0(0), so as to increase the decoding success rate.

Figure 13:
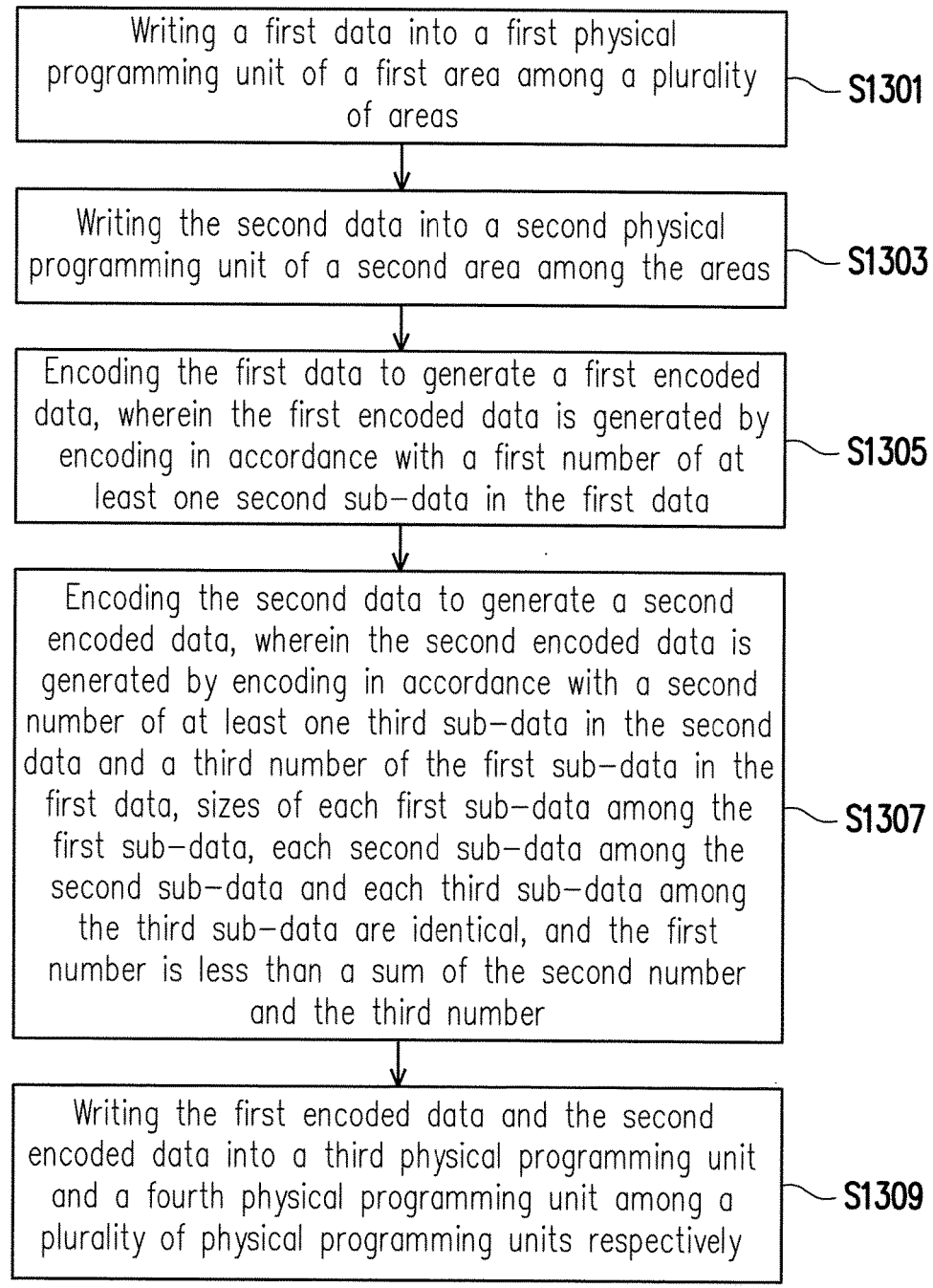
FIG. 13 is a flowchart illustrating a data encoding method according to the third exemplary embodiment of the invention.

FIG. 13 is a flowchart illustrating a data encoding method according to the third exemplary embodiment of the invention.

With reference to FIG. 13, in step S1301, the MMC 702 writes a first data into a first PPU of a first area among a plurality of areas in the RNVM module 406. In step S1303, the MMC 702 writes the second data into a second PPU of a second area among the areas in the RNVM module 406. In step S1305, the MMC 702 encodes the first data to generate a first encoded data. Here, the first encoded data is generated by encoding in accordance with a first number of at least one second sub-data in the first data. In step S1307, the MMC 702 encodes the second data to generate a second encoded data. Here, the second encoded data is generated by encoding in accordance with a second number of at least one third sub-data in the second data and a third number of the first sub-data in the first data, sizes of each first sub-data among the first sub-data, each second sub-data among the second sub-data and each third sub-data among the third sub-data are identical, and the first number is less than a sum of the second number and the third number. In step S1309, the MMC 702 writes the first encoded data and the second encoded data into a third PPU and a fourth PPU among a plurality of PPUs respectively. In particular, a precedence of steps in FIG. 13 is not limited by the invention. In another embodiment, for example, the MMC 702 may also execute step S1303 before executing step S1301, or may also execute step S1307 before executing step S1305.

In summary, the data encoding method proposed by the invention is capable of dividing the RNVM nodule into at least two areas. Each of the areas can generate the encoded data by using respective encoding methods of their own. Accordingly, the error checking and correcting capability of the encoded data for decoding data in the word lines with the higher error rate may be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data encoding method for a rewritable non-volatile memory module, wherein the rewritable non-volatile memory module comprises a plurality of physical programming units, and the data encoding method comprises:
    writing a first data into a first physical programming unit among the physical programming units;
    writing a second data into a second physical programming unit among the physical programming units;
    encoding by using the first data without using the second data to generate a first encoded data;
    encoding by using the second data and at least one first sub-data of the first data to generate a second encoded data; and
    writing the first encoded data and the second encoded data into a third physical programming unit and a fourth physical programming unit among the physical programming units respectively.

2. The data encoding method according to claim 1, wherein
    the first encoded data is configured to correct an error of a data stored in the first physical programming unit,
    the second encoded data is configured to correct the error of the data stored in the first physical programming unit or correct an error of a data stored in the second physical programming unit.

3. The data encoding method according to claim 2, further comprising:
    decoding the data stored in the first physical programming unit by using the first encoded data so as to correct the error of the data stored in the first physical programming unit;
    when the error of the data stored in the first physical programming unit is uncorrectable by using the first encoded data, decoding the data stored in the first physical programming unit by using the second encoded data so as to correct the error of the data stored in the first physical programming unit.

4. The data encoding method according to claim 2, further comprising:
    encoding by using the first data to generate a third encoded data;
    encoding by using the second data to generate a fourth encoded data; and
    writing the third encoded data into the first physical programming unit and writing the fourth encoded data into the second physical programming unit,
    wherein the third encoded data is configured to correct the error of the data stored in the first physical programming unit, and the fourth encoded data is configured to correct the error of the data stored in the second physical programming unit,
    wherein the first encoded data and the second encoded data are generated according to a first algorithm, the third encoded data and the fourth encoded data are generated according to a second algorithm, and the first algorithm is different from the second algorithm.

5. The data encoding method according to claim 4, wherein the first algorithm is a multi-frame encoding algorithm, and the second algorithm is a single-frame encoding algorithm.

6. The data encoding method according to claim 5, wherein
    the multi-frame encoding algorithm is configured to encode data stored in a plurality of fifth physical programming units among the physical programming units to generate a fifth encoded data, and the fifth encoded data is configured to correct an error of the data stored in the fifth physical programming units, the single-frame encoding algorithm is configured to correct one single sixth physical programming unit among the physical programming units to generate a sixth encoded data, and the sixth encoded data is configured to correct an error of data stored in the sixth physical programming unit.

7. The data encoding method according to claim 1, wherein the rewritable non-volatile memory module at least comprises a first area and a second area, each of the physical programming units belongs to at least one of the first area and the second area, an error rate of data stored in the physical programming units of the first area is greater than an error rate of data stored in the physical programming units of the second area, the physical programming units of the first area comprise the first physical programming unit, and the physical programming units of the second area comprise the second physical programming unit.

8. The data encoding method according to claim 7, wherein the rewritable non-volatile memory module comprises a plurality of word lines, a plurality of memory cells are disposed on the word lines, the physical programming units of the first area are formed by a plurality of first memory cells on a plurality of first word lines among the word lines, the physical programming units of the second area are formed by a plurality of second memory cells on a plurality of second word lines among the word lines, and the data encoding method further comprises:

determining a third word line among the word lines so as to identify the first word lines and the second word lines among the word lines according to the third word line, wherein the first word lines comprise at least one fourth word line among the word lines arranged in a first direction corresponding to the third word line, and the second word lines comprise at least one fifth word line among the word lines arranged in a second direction corresponding to the third word line.

9. The data encoding method according to claim 8, wherein the step of determining the third word line among the word lines comprises:

pre-determining or dynamically determining the third word line among the word lines.

10. The data encoding method according to claim 1, wherein the first encoded data is generated by encoding in accordance with a first number of at least one second sub-data in the first data, the second encoded data is generated by encoding in accordance with a second number of at least one third sub-data in the second data and a third number of the first sub-data in the first data, sizes of each first sub-data among the first sub-data, each second sub-data among the second sub-data and each third sub-data among the third sub-data are identical, and the first number is less than a sum of the second number and the third number.

11. A memory control circuit unit, for controlling a rewritable non-volatile memory module, wherein the rewritable non-volatile memory module comprises a plurality of physical programming units, and the memory control circuit unit comprises:

a host interface, configured to couple to a host system, a memory interface, configured to couple to a rewritable non-volatile memory module;

a memory management circuit, coupled to the host interface and the memory interface, wherein the memory management circuit is configured to write a first data into a first physical programming unit among the physical programming units, wherein the memory management circuit is further configured to write a second data into a second physical programming unit among the physical programming units, wherein the memory management circuit is further configured to encode by using the first data without using the second data to generate a first encoded data, wherein the memory management circuit is further configured to encode by using the second data and at least one first sub-data of the first data to generate a second encoded data, wherein the memory management circuit is further configured to write the first encoded data and the second encoded data into a third physical programming unit and a fourth physical programming unit among the physical programming units respectively.

12. The memory control circuit unit according to claim 11, wherein the first encoded data is configured to correct an error of a data stored in the first physical programming unit, the second encoded data is configured to correct the error of the data stored in the first physical programming unit or correct an error of a data stored in the second physical programming unit.

13. The memory control circuit unit according to claim 12, wherein the memory management circuit decodes the data stored in the first physical programming unit by using the first encoded data so as to correct the error of the data stored in the first physical programming unit, when the error of the data stored in the first physical programming unit is uncorrectable by using the first encoded data, the memory management circuit decodes the data stored in the first physical programming unit by using the second encoded data so as to correct the error of the data stored in the first physical programming unit.

14. The memory control circuit unit according to claim 12, wherein the memory management circuit encodes by using the first data to generate a third encoded data, the memory management circuit encodes by using the second data to generate a fourth encoded data, and the memory management circuit writes the third encoded data into the first physical programming unit and writes the fourth encoded data into the second physical programming unit, wherein the third encoded data is configured to correct the error of the data stored in the first physical programming unit, and the fourth encoded data is configured to correct the error of the data stored in the second physical programming unit, wherein the first encoded data and the second encoded data are generated according to a first algorithm, the third encoded data and the fourth encoded data are generated according to a second algorithm, and the first algorithm is different from the second algorithm.

15. The memory control circuit unit according to claim 14, wherein the first algorithm is a multi-frame encoding algorithm, and the second algorithm is a single-frame encoding algorithm.

16. The memory control circuit unit according to claim 15, wherein the multi-frame encoding algorithm is configured to encode data stored in a plurality of fifth physical programming units among the physical programming units to generate a fifth encoded data, and the fifth encoded data is configured to correct an error of the data stored in the fifth physical programming units, the single-frame encoding algorithm is configured to correct one single sixth physical programming unit among the physical programming units to generate a sixth encoded data, and the sixth encoded data is configured to correct an error of data stored in the sixth physical programming unit.

17. The memory control circuit unit according to claim 11, wherein the rewritable non-volatile memory module at least comprises a first area and a second area, each of the physical programming units belongs to at least one of the first area and the second area, an error rate of data stored in the physical programming units of the first area is greater than an error rate of data stored in the physical programming units of the second area, the physical programming units of the first area comprise the first physical programming unit, and the physical programming units of the second area comprise the second physical programming unit.

18. The memory control circuit unit according to claim 17, wherein the rewritable non-volatile memory module comprises a plurality of word lines, a plurality of memory cells are disposed on the word lines, the physical programming units of the first area are formed by a plurality of first memory cells on a plurality of first word lines among the word lines, the physical programming units of the second area are formed by a plurality of second memory cells on a plurality of second word lines among the word lines, wherein the memory management circuit determines a third word line among the word lines so as to identify the first word lines and the second word lines among the word lines according to the third word line, wherein the first word lines comprise at least one fourth word line among the word lines arranged in a first direction corresponding to the third word line, and the second word lines comprise at least one fifth word line among the word lines arranged in a second direction corresponding to the third word line.

19. The memory control circuit unit according to claim 18, wherein in the operation of determining the third word line among the word lines, the memory management circuit pre-determines or dynamically determines the third word line among the word lines.

20. The memory control circuit unit according to claim 11, wherein the first encoded data is generated by encoding in accordance with a first number of at least one second sub-data in the first data, the second encoded data is generated by encoding in accordance with a second number of at least one third sub-data in the second data and a third number of the first sub-data in the first data, sizes of each first sub-data among the first sub-data, each second sub-data among the second sub-data and each third sub-data among the third sub-data are identical, and the first number is less than a sum of the second number and the third number.

21. A memory storage device, comprising:

a connection interface unit, configured to couple to a host system;

a rewritable non-volatile memory module comprising a plurality of physical programming units; and a memory control circuit unit, coupled to the connection interface unit and the rewritable non-volatile memory module, wherein the memory control circuit unit is configured to write a first data into a first physical programming unit among the physical programming units, wherein the memory control circuit unit is further configured to write a second data into a second physical programming unit among the physical programming units, wherein the memory control circuit unit is further configured to encode by using the first data without using the second data to generate a first encoded data, wherein the memory control circuit unit is further configured to encode by using the second data and at least one first sub-data of the first data to generate a second encoded data, wherein the memory control circuit unit is further configured to write the first encoded data and the second encoded data into a third physical programming unit and a fourth physical programming unit among the physical programming units respectively.

22. The memory storage device according to claim 21, wherein the first encoded data is configured to correct an error of a data stored in the first physical programming unit, the second encoded data is configured to correct the error of the data stored in the first physical programming unit or correct an error of a data stored in the second physical programming unit.

23. The memory storage device according to claim 22, wherein the memory control circuit unit decodes the data stored in the first physical programming unit by using the first encoded data so as to correct the error of the data stored in the first physical programming unit, when the error of the data stored in the first physical programming unit is uncorrectable by using the first encoded data, the memory control circuit unit decodes the data stored in the first physical programming unit by using the second encoded data so as to correct the error of the data stored in the first physical programming unit.

24. The memory storage device according to claim 22, wherein the memory control circuit unit encodes by using the first data to generate a third encoded data, the memory control circuit unit encodes by using the second data to generate a fourth encoded data, and the memory control circuit unit writes the third encoded data into the first physical programming unit and writes the fourth encoded data into the second physical programming unit, wherein the third encoded data is configured to correct the error of the data stored in the first physical programming unit, and the fourth encoded data is configured to correct the error of the data stored in the second physical programming unit, wherein the first encoded data and the second encoded data are generated according to a first algorithm, the third encoded data and the fourth encoded data are generated according to a second algorithm, and the first algorithm is different from the second algorithm.

25. The memory storage device according to claim 24, wherein the first algorithm is a multi-frame encoding algorithm, and the second algorithm is a single-frame encoding algorithm.

26. The memory storage device according to claim 25, wherein
- the multi-frame encoding algorithm is configured to encode data stored in a plurality of fifth physical programming units among the physical programming units to generate a fifth encoded data, and the fifth encoded data is configured to correct an error of the data stored in the fifth physical programming units,
- the single-frame encoding algorithm is configured to correct one single sixth physical programming unit among the physical programming units to generate a sixth encoded data, and the sixth encoded data is configured to correct an error of data stored in the sixth physical programming unit.

27. The memory storage device according to claim 21, wherein the rewritable non-volatile memory module at least comprises a first area and a second area, each of the physical programming units belongs to at least one of the first area and the second area, an error rate of data stored in the physical programming units of the first area is greater than an error rate of data stored in the physical programming units of the second area, the physical programming units of the first area comprise the first physical programming unit, and the physical programming units of the second area comprise the second physical programming unit.

28. The memory storage device according to claim 27, wherein the rewritable non-volatile memory module comprises a plurality of word lines, a plurality of memory cells are disposed on the word lines, the physical programming units of the first area are formed by a plurality of first memory cells on a plurality of first word lines among the word lines, the physical programming units of the second area are formed by a plurality of second memory cells on a plurality of second word lines among the word lines, wherein
- the memory control circuit unit determines a third word line among the word lines so as to identify the first word lines and the second word lines among the word lines according to the third word line,
- wherein the first word lines comprise at least one fourth word line among the word lines arranged in a first direction corresponding to the third word line, and the second word lines comprise at least one fifth word line among the word lines arranged in a second direction corresponding to the third word line.

29. The memory storage device according to claim 28, wherein in the operation of determining the third word line among the word lines,
- the memory control circuit unit pre-determines or dynamically determines the third word line among the word lines.

30. The memory storage device according to claim 21, wherein the first encoded data is generated by encoding in accordance with a first number of at least one second sub-data in the first data,
- the second encoded data is generated by encoding in accordance with a second number of at least one third sub-data in the second data and a third number of the first sub-data in the first data,
- sizes of each first sub-data among the first sub-data, each second sub-data among the second sub-data and each third sub-data among the third sub-data are identical, and the first number is less than a sum of the second number and the third number.

\* \* \* \* \*